United States Patent
Banerjee et al.

(10) Patent No.: US 10,715,184 B2
(45) Date of Patent: Jul. 14, 2020

(54) TECHNIQUES FOR FAST IO AND LOW MEMORY CONSUMPTION WHILE USING ERASURE CODES

(71) Applicant: RUBRIK, INC., Palo Alto, CA (US)

(72) Inventors: Arijit Banerjee, Santa Clara, CA (US); Garvit Juniwal, Mountain View, CA (US); Adam Gee, San Francisco, CA (US)

(73) Assignee: RUBRIK, INC., Palo Alto, CA (US)

( * ) Notice: Subject to any disclaimer, the term of this patent is extended or adjusted under 35 U.S.C. 154(b) by 294 days.

(21) Appl. No.: 15/838,078

(22) Filed: Dec. 11, 2017

(65) Prior Publication Data

US 2019/0181887 A1    Jun. 13, 2019

(51) Int. Cl.
| | |
|---|---|
| *H03M 13/00* | (2006.01) |
| *G06F 3/06* | (2006.01) |
| *H03M 13/15* | (2006.01) |
| *G06F 11/10* | (2006.01) |
| *H03M 13/29* | (2006.01) |
| *H03M 13/37* | (2006.01) |
| *H03M 13/11* | (2006.01) |

(52) U.S. Cl.
CPC ........ *H03M 13/6505* (2013.01); *G06F 3/061* (2013.01); *G06F 3/065* (2013.01); *G06F 3/0619* (2013.01); *G06F 3/0665* (2013.01); *G06F 3/0689* (2013.01); *G06F 11/1076* (2013.01); *H03M 13/1515* (2013.01); *H03M 13/2906* (2013.01); *H03M 13/3761* (2013.01); *H03M 13/1102* (2013.01); *H03M 13/152* (2013.01)

(58) Field of Classification Search
CPC ........ G06F 3/06; G06F 11/10; G06F 11/1076; G06F 17/30; G06F 3/061; G06F 3/0619; G06F 3/065; G06F 3/0665; G06F 3/0689; G11B 5/09; H03M 13/1102; H03M 13/1515; H03M 13/152; H03M 13/2906; H03M 13/3761; H03M 13/6505; H04L 29/08

See application file for complete search history.

(56) References Cited

U.S. PATENT DOCUMENTS

| | | | |
|---|---|---|---|
| 10,338,972 B1 * | 7/2019 | Acheson | ................. G06F 3/065 |
| 2002/0194427 A1 * | 12/2002 | Hashemi | ............. G06F 11/1096 |
| | | | 711/114 |

(Continued)

*Primary Examiner* — Albert Decady
*Assistant Examiner* — Enamul M Kabir
(74) *Attorney, Agent, or Firm* — Schwegman Lundberg & Woessner, P.A.

(57) ABSTRACT

Methods and systems for improving the read and write performance of a distributed file system while limiting memory usage are described. The type of error correcting scheme applied to data, the partitioning of the data into data chunks, and the sizes of data slices within each of the data chunks used for storing electronic files within the distributed file system may be dynamically adjusted over time to optimize for fast IO performance while limiting memory usage (e.g., requiring less than 256 MB of RAM to generate and store code blocks). The file size of an electronic file to be stored, the amount of available memory for generating code blocks, and the amount of available disk space to store the electronic file may be used to set the data sizes of the data slices and the type of erasure code applied to data blocks associated with the data slices.

19 Claims, 18 Drawing Sheets

(56) References Cited

U.S. PATENT DOCUMENTS

| | | | |
|---|---|---|---|
| 2011/0078371 A1* | 3/2011 | Resch | G06F 3/0617 711/114 |
| 2013/0145232 A1* | 6/2013 | Grube | G06F 9/4401 714/763 |
| 2014/0046909 A1* | 2/2014 | Patiejunas | G06F 11/1076 707/687 |
| 2014/0351632 A1* | 11/2014 | Grube | G06F 11/1092 714/6.24 |
| 2014/0351633 A1* | 11/2014 | Grube | G06F 11/1076 714/6.24 |
| 2017/0357548 A1* | 12/2017 | Grube | H04L 1/00 |

* cited by examiner

```
Virtual Machine A, Version V7 {
    pBase,          ──▶  /snapshots/VM_A/s5/s5.full
    pF1,            ──▶  /snapshots/VM_A/s6/s6.delta
    pF2             ──▶  /snapshots/VM_A/s7/s7.delta
}
```

```
Virtual Machine A, Version V2 {
    pBase,          ──▶  /snapshots/VM_A/s5/s5.full
    pR1,            ──▶  /snapshots/VM_A/s4/s4.delta
    pR2,            ──▶  /snapshots/VM_A/s3/s3.delta
    pR3             ──▶  /snapshots/VM_A/s2/s2.delta
}
```

Versions of Virtual Machine A | Stored Files

Version V1 / Time T1 — R4
Version V2 / Time T2 — R3
Version V3 / Time T3 — R2
Version V4 / Time T4 — R1
Version V5 / Time T5 — R12
Version V6 / Time T6 — R11
} Reverse incrementals Version V7 / Time T7 — Base2 } Full image

FIG. 2D

Virtual Machine A, Version V7 {
    pBase2, ⟶ /snapshots/VM_A/s7/s7.full
}

FIG. 2E

Virtual Machine A, Version V2 {
    pBase2, ⟶ /snapshots/VM_A/s7/s7.full
    pR11, ⟶ /snapshots/VM_A/s6/s6.delta
    pR12, ⟶ /snapshots/VM_A/s5/s5.delta
    pR1, ⟶ /snapshots/VM_A/s4/s4.delta
    pR2, ⟶ /snapshots/VM_A/s3/s3.delta
    pR3 ⟶ /snapshots/VM_A/s2/s2.delta
}

FIG. 2F

```
Virtual Machine B, Version V1 {
    pBase,
    pR1,
    pR2,
    pF3
}
```

```
Virtual Machine C, Version V2 {
    pBase,
    pF1,
    pF5,
    pF6
}
```

```
Virtual Machine B, Version V1 {
    pBase2,
    pR11,
    pR12,
    pR1,
    pR2,
    pF3
}
```

```
Virtual Machine C, Version V2 {
    pBase2,
    pR11,
    pF5,
    pF6
}
```

Virtual Machine A, Version VS {
    pBaseA,
    pR4,
}

Virtual Machine A, Version VU {
    pBaseB,
    pR1,
    pR2,
    pR3
}

```
Virtual Machine A, Version VU {
    pBaseA,
    pF9
}
```

TECHNIQUES FOR FAST IO AND LOW MEMORY CONSUMPTION WHILE USING ERASURE CODES

BACKGROUND

Virtualization allows virtual hardware to be created and decoupled from the underlying physical hardware. For example, a hypervisor running on a host machine or server may be used to create one or more virtual machines that may each run the same operating system or different operating systems (e.g., a first virtual machine may run a Windows® operating system and a second virtual machine may run a Unix-like operating system such as OS X°). A virtual machine may comprise a software implementation of a physical machine. The virtual machine may include one or more virtual hardware devices, such as a virtual processor, a virtual memory, a virtual disk, or a virtual network interface card. The virtual machine may load and execute an operating system and applications from the virtual memory. The operating system and applications executed by the virtual machine may be stored using the virtual disk. The virtual machine may be stored (e.g., using a datastore comprising one or more physical storage devices) as a set of files including a virtual disk file for storing the contents of the virtual disk and a virtual machine configuration file for storing configuration settings for the virtual machine. The configuration settings may include the number of virtual processors (e.g., four virtual CPUs), the size of a virtual memory, and the size of a virtual disk (e.g., a 10 GB virtual disk) for the virtual machine.

DETAILED DESCRIPTION

Figure 1A:
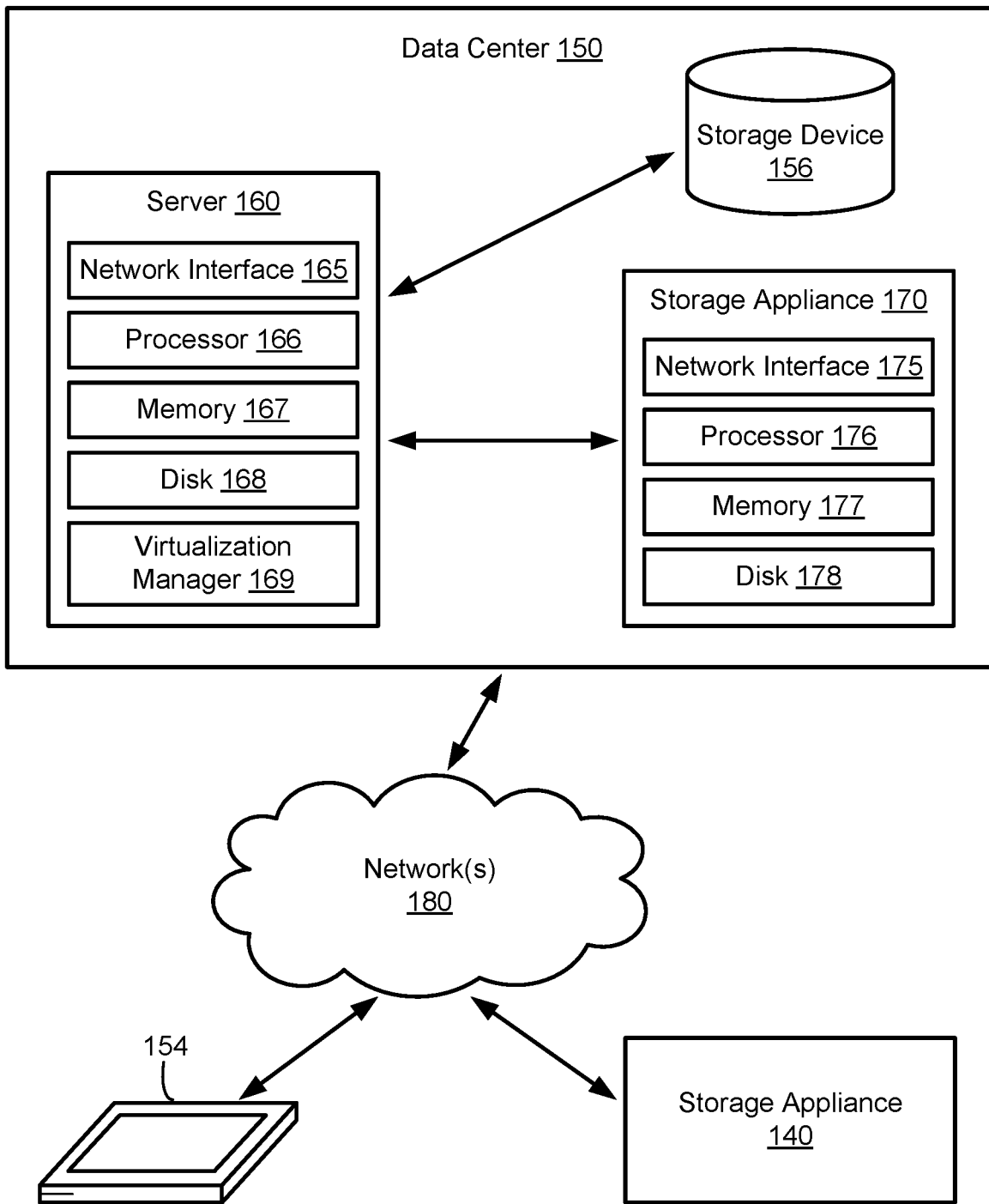
FIG. 1A depicts one embodiment of a networked computing environment.

Technology is described for improving the read and write performance of a distributed file system while limiting memory usage. In some cases, the type of error correcting scheme applied to data (e.g., the type of erasure code applied to data to protect the data against bit errors), the grouping or partitioning of the data into data chunks, and the sizes of data slices within each of the data chunks used for storing electronic files (e.g., database files or virtual disk files) within the distributed file system may be dynamically adjusted over time to optimize for fast IO performance (e.g., fast single stream read and write performance) while limiting memory usage (e.g., using less than 1 GB of RAM to generate and store code blocks). Before writing an electronic file to a plurality of disks associated with the distributed file system, the electronic file may be partitioned into a plurality of stripes (e.g., the file may be partitioned into four equal-sized stripes of data or two different-sized stripes of data). The data within each stripe of the plurality of stripes may be mapped or assigned to a plurality of data chunks. Each data chunk of the plurality of data chunks may comprise one or more data slices. Each data slice of the one or more data slices may comprise a different portion of the electronic file or a different contiguous series of data bits from the electronic file. A wedge of data slices across the plurality of data chunks may comprise data blocks and corresponding code blocks for the data blocks that may be written in parallel to the plurality of disks or read in parallel from the plurality of disks. The wedge may comprise a horizontal grouping of data slices across the plurality of data chunks in which the grouping comprises one data slice from each of the plurality of data chunks. The plurality of disks may comprise one or more hard disk drives (HDDs) and/or one or more solid-state drives (SSDs). The file size of the electronic file or the data size of a stripe corresponding with a portion of the electronic file to be stored using the distributed file system, the amount of available memory used to generate code blocks (e.g., the amount of RAM required to generate the code blocks), the amount of available disk space within the plurality of disks to store the electronic file, and/or the types of disks associated with the plurality of disks may be used to set or determine the data sizes of the data slices within a wedge and/or the type of erasure code or error correcting code applied to the data blocks of the wedge.

Error correcting codes may be used to generate and store redundant information (e.g., corresponding with code blocks) along with protected data (e.g., corresponding with data blocks) in order to detect and correct data errors occurring to the protected data or the redundant information during storage or transmission of the protected data and the redundant information. In some cases, erasure coding or parity based data protection techniques may be applied to the protected data (e.g., using a Reed-Solomon code, a BCH code, a Hamming code, or a Low-Density Parity-Check code). Reed-Solomon codes may be used to encode data into data blocks and code blocks. The code blocks may be computed by buffering the data blocks in memory and then applying a system of linear equations over the data blocks. In one example, four 64 KB data blocks may be protected from bit errors by generating and storing two 64 KB code blocks along with the data blocks. In another example, a wedge of data slices may comprise six 64 KB data slices corresponding with data slices within six different data chunks with four of the data slices comprising data blocks and two of the data slices comprising code blocks. In this case, the wedge of data slices may implement a four data block/two code block (4+2) Reed Solomon encoding. After the two code blocks for the wedge have been generated, the four data blocks and the two code blocks may be written to six disks such that each disk of the six disks stores one of the two code blocks or one of the four data blocks. The data sizes of the data slices within other wedges may be set and/or adjusted over time to limit the amount of memory required to store the data blocks and compute the corresponding code blocks and then write the data blocks and the code blocks to a plurality of disks (e.g., comprising six HDDs or six SSDs).

In one embodiment, the data size of a data slice may be increased from 64 KB to 128 KB in order to allow reads of a particular size (e.g., 128 KB) to read from only a single disk or allow reads of a particular size (e.g., 256 KB) to be read from a subset of the plurality of disks less than all of the disks of the plurality of disks (e.g., reading from only two disks of the plurality of disks instead of having to read from more than the two disks). One benefit of increasing the size of the data slices (or the length of the data slices) in a wedge is that the number of disks that need to read to read back data may be reduced. Moreover, if the disks are on different nodes, then a reduction in the number of disks needing to be read may also reduce the number of nodes needing to be read from, which would reduce network congestion and improve network bandwidth. Thus, a larger data slice size (or data slice length) may reduce the read latency for small random reads; however, the larger data slice size may increase the amount of memory required to generate code blocks and require additional time to generate and store the code blocks for the wedge. In another embodiment, the data size of a data slice may be decreased from 256 KB to 64 KB in order to reduce the amount of memory needed to store and generate code blocks. In one example, if the amount of available memory is less than a threshold amount of memory (e.g., there is less than 512 MB of RAM available), then the data sizes of the data slices may be reduced in order to reduce the amount of memory required to store the data block and to generate the corresponding code blocks.

In one embodiment, a file size of an electronic file to be stored using a distributed file system may be used to determine the number of stripes that the electronic file is partitioned into, the size of the stripes, the data sizes (or lengths) of the data slices within a wedge, and/or the type of erasure code or error correcting code applied to data blocks to generate code blocks for the wedge. In one example, the electronic file may be partitioned into a number of equal-sized stripes (e.g., the electronic file may be partitioned into four equal-sized stripes). In another example, the electronic file may be partitioned into a number of stripes of a particular stripe size (e.g., the electronic file may be partitioned into stripes comprising data sizes of at most 256 MB of data). In another example, if the file size of the electronic file is greater than a threshold file size (e.g., is greater than 1 GB), then the data sizes of the data slices within each wedge may be set to a first data size (e.g., 128 KB); however, if the file size of the electronic file is not greater than the threshold file size, then the data sizes of the data slices within each wedge may be set to a second data size different from the first data size (e.g., 64 KB). The second data size may be less than the first data size. In another example, if the file size of the electronic file is greater than a threshold file size (e.g., is greater than 2 GB) or a stripe size is greater than a threshold data size (e.g., the data size of a stripe is greater than 256 MB), then a first error correcting scheme may be applied to the data (e.g., a four data block/two code block Reed Solomon encoding); however, if the file size of the electronic file is not greater than the threshold file size or the stripe size is not greater than the threshold data size, then a second error correcting scheme different from the first error correcting scheme may be applied to the data (e.g., a six data block/three code block Reed Solomon encoding or a BCH code with a different number of code blocks than that used by the first error correcting scheme).

In some cases, the data sizes of the data slices within a wedge and/or the type of erasure coding scheme applied to the data blocks of the wedge may be set per each file or on a file-level basis. For example, a first file may use a data size for the data slices in each wedge of 64 KB, while a second file may use a data size for the data slices in each wedge of 256 KB. In others cases, the data sizes of the data slices within a wedge and/or the type of erasure coding scheme applied to the data blocks of the wedge may be set per each stripe of a file or on a stripe-level basis. In one example, an electronic file may be partitioned into two stripes and a first stripe of the two stripes may use a data size for the data slices in each wedge of 128 KB, while a second stripe of the two stripes may use a data size for the data slices in each wedge of 512 KB. In another example, an electronic file may be partitioned into two stripes of different sizes and a first stripe of the two stripes (e.g., with a 1 GB size) may use a data size for the data slices in each wedge of 128 KB, while a second stripe of the two stripes (e.g., with a 2 GB size) may use a data size for the data slices in each wedge of 512 KB.

In another embodiment, the type of file associated with the electronic file to be stored may be used to determine the data sizes of the data slices within a wedge and/or the type of erasure code or error correcting code applied to data corresponding with a particular stripe of the electronic file. In one example, if the electronic file comprises a database file, then the data sizes of the data slices within each wedge may be set to a first data size (e.g., 64 KB); however, if the electronic file comprises a virtual disk file, then the data sizes of the data slices within each wedge may be set to a second data size (e.g., 256 KB) different from the first data size. In another example, if the electronic file comprises a database file, then a first error correcting scheme may be applied to the data (e.g., a four data block/two code block Reed Solomon encoding); however, if the electronic file comprises a virtual disk file, then a second error correcting scheme different from the first error correcting scheme may be applied to the data (e.g., a six data block/three code block Reed Solomon encoding).

In another embodiment, an amount of available memory (e.g., the amount of RAM) for storing data blocks and generating and storing code blocks from the data blocks using an error correcting scheme (e.g., using a Reed Solomon encoding) may be used to determine the data sizes of the data slices within a wedge and/or the type of erasure code or error correcting code applied to generate the code blocks for the wedge. In one example, if the amount of available memory is less than a threshold memory size (e.g., the amount of available memory is less than 256 MB), then the data sizes of the data slices within each wedge may be set to a first data size (e.g., 64 KB); however, if the amount of available memory is greater than or equal to the threshold memory size (e.g., the amount of available memory is greater than 256 MB), then the data sizes of the data slices within each wedge may be set to a second data size different from the first data size (e.g., 256 KB). The second data size may be greater than the first data size. In another example, if the amount of available memory is less than a threshold memory size (e.g., the amount of available memory is less than 256 MB), then a first error correcting scheme may be applied to the data (e.g., a four data block/two code block Reed Solomon encoding); however, if the amount of available memory is greater than or equal to the threshold memory size (e.g., the amount of available memory is greater than 256 MB), then a second error correcting scheme different from the first error correcting scheme may be applied to the data (e.g., a six data block/three code block Reed Solomon encoding or a BCH code with a different number of code blocks than that used by the first error correcting scheme).

In another embodiment, an amount of available disk space for a plurality of disks associated with a distributed file system or the amount of disk space used by the plurality of disks may be used to determine the data sizes of the data slices within a wedge and/or the type of erasure code or error correcting code applied to generate code blocks for the wedge. In one example, if the amount of available disk space for one or more disks is less than a threshold disk size (e.g., the amount of available disk space is less than 1 TB), then the data sizes of the data slices within each wedge may be set to a first data size (e.g., 64 KB); however, if the amount of available disk space for the one or more disks is greater than or equal to the threshold disk size (e.g., the amount of available disk space is greater than 1 TB), then the data sizes of the data slices within each wedge may be set to a second data size different from the first data size (e.g., 256 KB). The second data size may be greater than the first data size.

In another embodiment, the type of disks associated with the plurality of disks may be used to determine the data sizes of the data slices within a wedge and/or the type of erasure code or error correcting code applied to data corresponding with a particular stripe of the electronic file. In one example, if the disks comprise HDDs, then the data sizes of the data slices within each wedge may be set to a first data size (e.g., 256 KB); however, if the disks comprise SSDs, then the data sizes of the data slices within each wedge may be set to a second data size different from the first data size (e.g., 64 KB).

An integrated data management and storage system may be configured to manage the automated storage, backup, deduplication, replication, recovery, and archival of data within and across physical and virtual computing environments. The integrated data management and storage system may provide a unified primary and secondary storage system with built-in data management that may be used as both a backup storage system and a "live" primary storage system for primary workloads. In some cases, the integrated data management and storage system may manage the extraction and storage of historical snapshots associated with different point in time versions of virtual machines and/or real machines (e.g., a hardware server, a laptop, a tablet computer, a smartphone, or a mobile computing device) and provide near instantaneous recovery of a backed-up version of a virtual machine, a real machine, or one or more files residing on the virtual machine or the real machine. The integrated data management and storage system may allow backed-up versions of real or virtual machines to be directly mounted or made accessible to primary workloads in order to enable the near instantaneous recovery of the backed-up versions and allow secondary workloads (e.g., workloads for experimental or analytics purposes) to directly use the integrated data management and storage system as a primary storage target to read or modify past versions of data.

The integrated data management and storage system may include a distributed cluster of storage nodes that presents itself as a unified storage system even though numerous storage nodes may be connected together and the number of connected storage nodes may change over time as storage nodes are added to or removed from the cluster. The integrated data management and storage system may utilize a scale-out node based architecture in which a plurality of data storage appliances comprising one or more nodes are in communication with each other via one or more networks. Each storage node may include two or more different types of storage devices and control circuitry configured to store, deduplicate, compress, and/or encrypt data stored using the two or more different types of storage devices. In one example, a storage node may include two solid-state drives (SSDs), three hard disk drives (HDDs), and one or more processors configured to concurrently read data from and/or write data to the storage devices. The integrated data management and storage system may replicate and distribute versioned data, metadata, and task execution across the distributed cluster to increase tolerance to node and disk failures (e.g., snapshots of a virtual machine may be triply mirrored across the cluster). Data management tasks may be assigned and executed across the distributed cluster in a fault tolerant manner based on the location of data within the cluster (e.g., assigning tasks to nodes that store data related to the task) and node resource availability (e.g., assigning tasks to nodes with sufficient compute or memory capacity for the task).

The integrated data management and storage system may apply a data backup and archiving schedule to backed-up real and virtual machines to enforce various backup service level agreements (SLAs), recovery point objectives (RPOs), recovery time objectives (RTOs), data retention requirements, and other data backup, replication, and archival policies across the entire data lifecycle. For example, the data backup and archiving schedule may require that snapshots of a virtual machine are captured and stored every four hours for the past week, every day for the past six months, and every week for the past five years.

As virtualization technologies are adopted into information technology (IT) infrastructures, there is a growing need for recovery mechanisms to support mission critical application deployment within a virtualized infrastructure. However, a virtualized infrastructure may present a new set of challenges to the traditional methods of data management due to the higher workload consolidation and the need for instant, granular recovery. The benefits of using an integrated data management and storage system include the ability to reduce the amount of data storage required to backup real and virtual machines, the ability to reduce the amount of data storage required to support secondary or non-production workloads, the ability to provide a non-passive storage target in which backup data may be directly accessed and modified, and the ability to quickly restore earlier versions of virtual machines and files stored locally or in the cloud.

FIG. 1A depicts one embodiment of a networked computing environment 100 in which the disclosed technology may be practiced. As depicted, the networked computing environment 100 includes a data center 150, a storage appliance 140, and a computing device 154 in communication with each other via one or more networks 180. The networked computing environment 100 may include a plurality of computing devices interconnected through one or more networks 180. The one or more networks 180 may allow computing devices and/or storage devices to connect to and communicate with other computing devices and/or other storage devices. In some cases, the networked computing environment may include other computing devices and/or other storage devices not shown. The other computing devices may include, for example, a mobile computing device, a non-mobile computing device, a server, a workstation, a laptop computer, a tablet computer, a desktop computer, or an information processing system. The other storage devices may include, for example, a storage area network storage device, a networked-attached storage device, a hard disk drive, a solid-state drive, or a data storage system. The one or more networks 180 may include a cellular network, a mobile network, a wireless network, a wired network, a secure network such as an enterprise private network, an unsecure network such as a wireless open network, a local area network (LAN), a wide area network (WAN), and the Internet.

The data center 150 may include one or more servers, such as server 160, in communication with one or more storage devices, such as storage device 156. The one or more servers may also be in communication with one or more storage appliances, such as storage appliance 170. The server 160, storage device 156, and storage appliance 170 may be in communication with each other via a networking fabric connecting servers and data storage units within the data center to each other. The server 160 may comprise a production hardware server. The storage appliance 170 may include a data management system for backing up virtual machines, real machines, virtual disks, real disks, and/or electronic files within the data center 150. The server 160 may be used to create and manage one or more virtual machines associated with a virtualized infrastructure. The one or more virtual machines may run various applications, such as a database application or a web server. The storage device 156 may include one or more hardware storage devices for storing data, such as a hard disk drive (HDD), a magnetic tape drive, a solid-state drive (SSD), a storage area network (SAN) storage device, or a networked-attached storage (NAS) device. In some cases, a data center, such as data center 150, may include thousands of servers and/or data storage devices in communication with each other. The data storage devices may comprise a tiered data storage infrastructure (or a portion of a tiered data storage infrastructure). The tiered data storage infrastructure may allow for the movement of data across different tiers of a data storage infrastructure between higher-cost, higher-performance storage devices (e.g., solid-state drives and hard disk drives) and relatively lower-cost, lower-performance storage devices (e.g., magnetic tape drives).

A server, such as server 160, may allow a client to download information or files (e.g., executable, text, application, audio, image, or video files) from the server or to perform a search query related to particular information stored on the server. In some cases, a server may act as an application server or a file server. In general, a server may refer to a hardware device that acts as the host in a client-server relationship or a software process that shares a resource with or performs work for one or more clients. One embodiment of server 160 includes a network interface 165, processor 166, memory 167, disk 168, and virtualization manager 169 all in communication with each other. Network interface 165 allows server 160 to connect to one or more networks 180. Network interface 165 may include a wireless network interface and/or a wired network interface. Processor 166 allows server 160 to execute computer readable instructions stored in memory 167 in order to perform processes described herein. Processor 166 may include one or more processing units, such as one or more CPUs and/or one or more GPUs. Memory 167 may comprise one or more types of memory (e.g., RAM, SRAM, DRAM, ROM, EEPROM, Flash, etc.). Disk 168 may include a hard disk drive and/or a solid-state drive. Memory 167 and disk 168 may comprise hardware storage devices.

The virtualization manager 169 may manage a virtualized infrastructure and perform management operations associated with the virtualized infrastructure. For example, the virtualization manager 169 may manage the provisioning of virtual machines running within the virtualized infrastructure and provide an interface to computing devices interacting with the virtualized infrastructure. The virtualization manager 169 may also perform various virtual machine related tasks, such as cloning virtual machines, creating new virtual machines, monitoring the state of virtual machines, moving virtual machines between physical hosts for load balancing purposes, and facilitating backups of virtual machines.

One embodiment of storage appliance 170 includes a network interface 175, processor 176, memory 177, and disk 178 all in communication with each other. Network interface 175 allows storage appliance 170 to connect to one or more networks 180. Network interface 175 may include a wireless network interface and/or a wired network interface. Processor 176 allows storage appliance 170 to execute computer readable instructions stored in memory 177 in order to perform processes described herein. Processor 176 may include one or more processing units, such as one or more CPUs and/or one or more GPUs. Memory 177 may comprise one or more types of memory (e.g., RAM, SRAM, DRAM, ROM, EEPROM, NOR Flash, NAND Flash, etc.). Disk 178 may include a hard disk drive and/or a solid-state drive. Memory 177 and disk 178 may comprise hardware storage devices.

In one embodiment, the storage appliance 170 may include four machines. Each of the four machines may include a multi-core CPU, 64 GB of RAM, a 400 GB SSD, three 4 TB HDDs, and a network interface controller. In this case, the four machines may be in communication with the one or more networks 180 via the four network interface controllers. The four machines may comprise four nodes of a server cluster. The server cluster may comprise a set of physical machines that are connected together via a network. The server cluster may be used for storing data associated with a plurality of virtual machines, such as backup data associated with different point in time versions of one or more virtual machines.

In another embodiment, the storage appliance 170 may comprise a virtual appliance that comprises four virtual machines. Each of the virtual machines in the virtual appliance may have 64 GB of virtual memory, a 12 TB virtual disk, and a virtual network interface controller. In this case, the four virtual machines may be in communication with the one or more networks 180 via the four virtual network interface controllers. The four virtual machines may comprise four nodes of a virtual cluster.

The networked computing environment 100 may provide a cloud computing environment for one or more computing devices. In one embodiment, the networked computing environment 100 may include a virtualized infrastructure that provides software, data processing, and/or data storage services to end users accessing the services via the networked computing environment. In one example, networked computing environment 100 may provide cloud-based work productivity or business related applications to a computing device, such as computing device 154. The computing device 154 may comprise a mobile computing device or a tablet computer. The storage appliance 140 may comprise a cloud-based data management system for backing up virtual machines and/or files within a virtualized infrastructure, such as virtual machines running on server 160 or files stored on server 160.

In some embodiments, the storage appliance 170 may manage the extraction and storage of virtual machine snapshots associated with different point in time versions of one or more virtual machines running within the data center 150. A snapshot of a virtual machine may correspond with a state of the virtual machine at a particular point in time. In some cases, the snapshot may capture the state of various virtual machine settings and the state of one or more virtual disks for the virtual machine. In response to a restore command from the server 160, the storage appliance 170 may restore a point in time version of a virtual machine or restore point in time versions of one or more files located on the virtual machine and transmit the restored data to the server 160. In response to a mount command from the server 160, the storage appliance 170 may allow a point in time version of a virtual machine to be mounted and allow the server 160 to read and/or modify data associated with the point in time version of the virtual machine. To improve storage density, the storage appliance 170 may deduplicate and compress data associated with different versions of a virtual machine and/or deduplicate and compress data associated with different virtual machines. To improve system performance, the storage appliance 170 may first store virtual machine snapshots received from a virtualized environment in a cache, such as a flash-based cache. The cache may also store popular data or frequently accessed data (e.g., based on a history of virtual machine restorations), incremental files associated with commonly restored virtual machine versions, and current day incremental files or incremental files corresponding with snapshots captured within the past 24 hours.

An incremental file may comprise a forward incremental file or a reverse incremental file. A forward incremental file may include a set of data representing changes that have occurred since an earlier point in time snapshot of a virtual machine. To generate a snapshot of the virtual machine corresponding with a forward incremental file, the forward incremental file may be combined with an earlier point in time snapshot of the virtual machine (e.g., the forward incremental file may be combined with the last full image of the virtual machine that was captured before the forward incremental was captured and any other forward incremental files that were captured subsequent to the last full image and prior to the forward incremental file). A reverse incremental file may include a set of data representing changes from a later point in time snapshot of a virtual machine. To generate a snapshot of the virtual machine corresponding with a reverse incremental file, the reverse incremental file may be combined with a later point in time snapshot of the virtual machine (e.g., the reverse incremental file may be combined with the most recent snapshot of the virtual machine and any other reverse incremental files that were captured prior to the most recent snapshot and subsequent to the reverse incremental file).

The storage appliance 170 may provide a user interface (e.g., a web-based interface or a graphical user interface) that displays virtual machine information, such as identifications of the virtual machines protected and the historical versions or time machine views for each of the virtual machines protected, and allows an end user to search, select, and control virtual machines managed by the storage appliance. A time machine view of a virtual machine may include snapshots of the virtual machine over a plurality of points in time. Each snapshot may comprise the state of the virtual machine at a particular point in time. Each snapshot may correspond with a different version of the virtual machine (e.g., Version 1 of a virtual machine may correspond with the state of the virtual machine at a first point in time and Version 2 of the virtual machine may correspond with the state of the virtual machine at a second point in time subsequent to the first point in time).

Figure 1B:
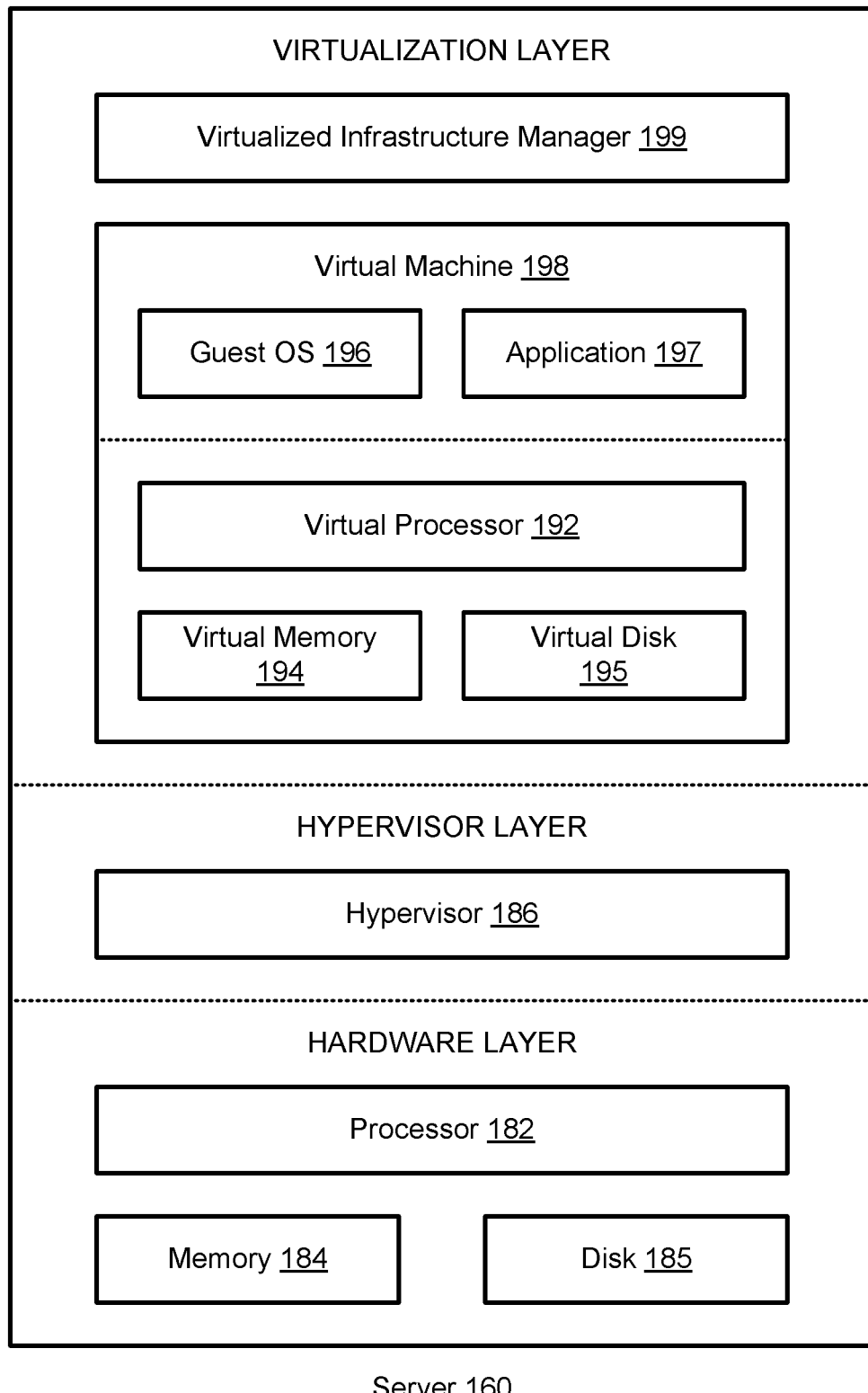
FIG. 1B depicts one embodiment of a server.

FIG. 1B depicts one embodiment of server 160 in FIG. 1A. The server 160 may comprise one server out of a plurality of servers that are networked together within a data center. In one example, the plurality of servers may be positioned within one or more server racks within the data center. As depicted, the server 160 includes hardware-level components and software-level components. The hardware-level components include one or more processors 182, one or more memory 184, and one or more disks 185. The software-level components include a hypervisor 186, a virtualized infrastructure manager 199, and one or more virtual machines, such as virtual machine 198. The hypervisor 186 may comprise a native hypervisor or a hosted hypervisor. The hypervisor 186 may provide a virtual operating platform for running one or more virtual machines, such as virtual machine 198. Virtual machine 198 includes a plurality of virtual hardware devices including a virtual processor 192, a virtual memory 194, and a virtual disk 195. The virtual disk 195 may comprise a file stored within the one or more disks 185. In one example, a virtual machine may include a plurality of virtual disks, with each virtual disk of the plurality of virtual disks associated with a different file stored on the one or more disks 185. Virtual machine 198 may include a guest operating system 196 that runs one or more applications, such as application 197. The virtualized infrastructure manager 199, which may correspond with the virtualization manager 169 in FIG. 1A, may run on a virtual machine or natively on the server 160. The virtualized infrastructure manager 199 may provide a centralized platform for managing a virtualized infrastructure that includes a plurality of virtual machines.

In one embodiment, the server 160 may use the virtualized infrastructure manager 199 to facilitate backups for a plurality of virtual machines (e.g., eight different virtual machines) running on the server 160. Each virtual machine running on the server 160 may run its own guest operating system and its own set of applications. Each virtual machine running on the server 160 may store its own set of files using one or more virtual disks associated with the virtual machine (e.g., each virtual machine may include two virtual disks that are used for storing data associated with the virtual machine).

In one embodiment, a data management application running on a storage appliance, such as storage appliance 140 in FIG. 1A or storage appliance 170 in FIG. 1A, may request a snapshot of a virtual machine running on server 160. The snapshot of the virtual machine may be stored as one or more files, with each file associated with a virtual disk of the virtual machine. A snapshot of a virtual machine may correspond with a state of the virtual machine at a particular point in time. The particular point in time may be associated with a time stamp. In one example, a first snapshot of a virtual machine may correspond with a first state of the virtual machine (including the state of applications and files stored on the virtual machine) at a first point in time (e.g., 6:30 p.m. on Jun. 29, 2017) and a second snapshot of the virtual machine may correspond with a second state of the virtual machine at a second point in time subsequent to the first point in time (e.g., 6:30 p.m. on Jun. 30, 2017).

In response to a request for a snapshot of a virtual machine at a particular point in time, the virtualized infrastructure manager 199 may set the virtual machine into a frozen state or store a copy of the virtual machine at the particular point in time. The virtualized infrastructure manager 199 may then transfer data associated with the virtual machine (e.g., an image of the virtual machine or a portion of the image of the virtual machine) to the storage appliance. The data associated with the virtual machine may include a set of files including a virtual disk file storing contents of a virtual disk of the virtual machine at the particular point in time and a virtual machine configuration file storing configuration settings for the virtual machine at the particular point in time. The contents of the virtual disk file may include the operating system used by the virtual machine, local applications stored on the virtual disk, and user files (e.g., images and word processing documents). In some cases, the virtualized infrastructure manager 199 may transfer a full image of the virtual machine to the storage appliance or a plurality of data blocks corresponding with the full image (e.g., to enable a full image-level backup of the virtual machine to be stored on the storage appliance). In other cases, the virtualized infrastructure manager 199 may transfer a portion of an image of the virtual machine associated with data that has changed since an earlier point in time prior to the particular point in time or since a last snapshot of the virtual machine was taken. In one example, the virtualized infrastructure manager 199 may transfer only data associated with changed blocks stored on a virtual disk of the virtual machine that have changed since the last snapshot of the virtual machine was taken. In one embodiment, the data management application may specify a first point in time and a second point in time and the virtualized infrastructure manager 199 may output one or more changed data blocks associated with the virtual machine that have been modified between the first point in time and the second point in time.

Figure 1C:
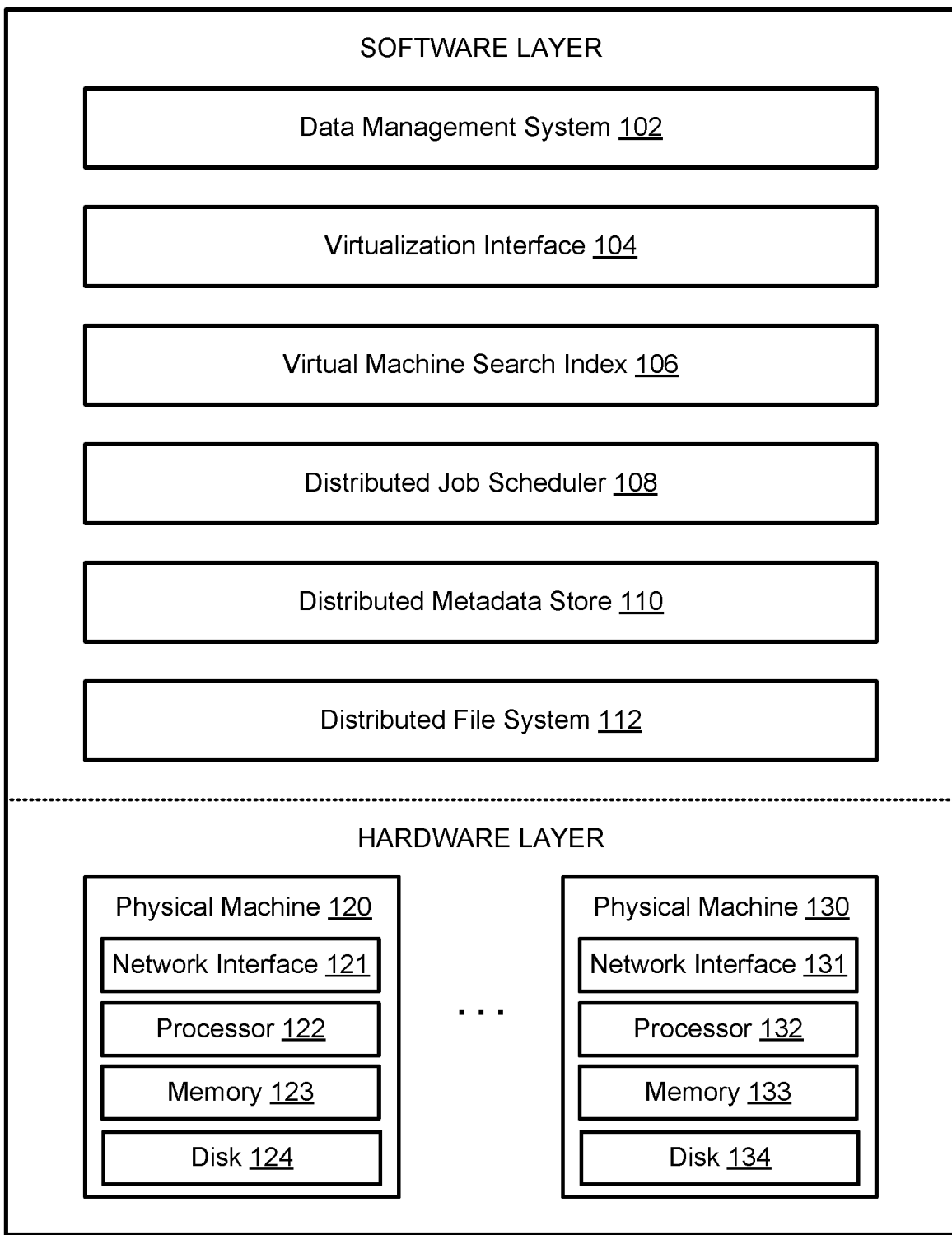
FIG. 1C depicts one embodiment of a storage appliance.

FIG. 1C depicts one embodiment of a storage appliance, such as storage appliance 170 in FIG. 1A. The storage appliance may include a plurality of physical machines that may be grouped together and presented as a single computing system. Each physical machine of the plurality of physical machines may comprise a node in a cluster (e.g., a failover cluster). As depicted, the storage appliance 170 includes hardware-level components and software-level components. The hardware-level components include one or more physical machines, such as physical machine 120 and physical machine 130. The physical machine 120 includes a network interface 121, processor 122, memory 123, and disk 124 all in communication with each other. Processor 122 allows physical machine 120 to execute computer readable instructions stored in memory 123 to perform processes described herein. Disk 124 may include a hard disk drive and/or a solid-state drive. The physical machine 130 includes a network interface 131, processor 132, memory 133, and disk 134 all in communication with each other. Processor 132 allows physical machine 130 to execute computer readable instructions stored in memory 133 to perform processes described herein. Disk 134 may include a hard disk drive and/or a solid-state drive. In some cases, disk 134 may include a flash-based SSD or a hybrid HDD/SSD drive. In one embodiment, the storage appliance 170 may include a plurality of physical machines arranged in a cluster (e.g., eight machines in a cluster). Each of the plurality of physical machines may include a plurality of multi-core CPUs, 128 GB of RAM, a 500 GB SSD, four 4 TB HDDs, and a network interface controller.

As depicted in FIG. 1C, the software-level components of the storage appliance 170 may include data management system 102, a virtualization interface 104, a distributed job scheduler 108, a distributed metadata store 110, a distributed file system 112, and one or more virtual machine search indexes, such as virtual machine search index 106. In one embodiment, the software-level components of the storage appliance 170 may be run using a dedicated hardware-based appliance. In another embodiment, the software-level components of the storage appliance 170 may be run from the cloud (e.g., the software-level components may be installed on a cloud service provider).

In some cases, the data storage across a plurality of nodes in a cluster (e.g., the data storage available from the one or more physical machines) may be aggregated and made available over a single file system namespace (e.g., /snapshots/). A directory for each virtual machine protected using the storage appliance 170 may be created (e.g., the directory for Virtual Machine A may be /snapshots/VM_A). Snapshots and other data associated with a virtual machine may reside within the directory for the virtual machine. In one example, snapshots of a virtual machine may be stored in subdirectories of the directory (e.g., a first snapshot of Virtual Machine A may reside in /snapshots/VM_A/s1/ and a second snapshot of Virtual Machine A may reside in /snapshots/VM_A/s2/).

The distributed file system 112 may present itself as a single file system, in which as new physical machines or nodes are added to the storage appliance 170, the cluster may automatically discover the additional nodes and automatically increase the available capacity of the file system for storing files and other data. Each file stored in the distributed file system 112 may be partitioned into one or more chunks. Each of the one or more chunks may be stored within the distributed file system 112 as a separate file. The files stored within the distributed file system 112 may be replicated or mirrored over a plurality of physical machines, thereby creating a load-balanced and fault tolerant distributed file system. In one example, storage appliance 170 may include ten physical machines arranged as a failover cluster and a first file corresponding with a full-image snapshot of a virtual machine (e.g., /snapshots/VM_A/s1/s1.full) may be replicated and stored on three of the ten machines. In some cases, the data chunks associated with a file stored in the distributed file system 112 may include replicated data (e.g., due to n-way mirroring) or parity data (e.g., due to erasure coding). When a disk storing one of the data chunks fails, then the distributed file system may regenerate the lost data and store the lost data using a new disk.

In one embodiment, the distributed file system 112 may be used to store a set of versioned files corresponding with a virtual machine. The set of versioned files may include a first file comprising a full image of the virtual machine at a first point in time and a second file comprising an incremental file relative to the full image. The set of versioned files may correspond with a snapshot chain for the virtual machine. The distributed file system 112 may determine a first set of data chunks that includes redundant information for the first file (e.g., via application of erasure code techniques) and store the first set of data chunks across a plurality of nodes within a cluster. The placement of the first set of data chunks may be determined based on the locations of other data related to the first set of data chunks (e.g., the locations of other chunks corresponding with the second file or other files within the snapshot chain for the virtual machine). In some embodiments, the distributed file system 112 may also co-locate data chunks or replicas of virtual machines discovered to be similar to each other in order to allow for cross virtual machine deduplication. In this case, the placement of the first set of data chunks may be determined based on the locations of other data corresponding with a different virtual machine that has been determined to be sufficiently similar to the virtual machine.

The distributed metadata store 110 may comprise a distributed database management system that provides high availability without a single point of failure. The distributed metadata store 110 may act as a quick-access database for various components in the software stack of the storage appliance 170 and may store metadata corresponding with stored snapshots using a SSD or a Flash-based storage device. In one embodiment, the distributed metadata store 110 may comprise a database, such as a distributed document oriented database. The distributed metadata store 110 may be used as a distributed key value storage system. In one example, the distributed metadata store 110 may comprise a distributed NoSQL key value store database. In some cases, the distributed metadata store 110 may include a partitioned row store, in which rows are organized into tables or other collections of related data held within a structured format within the key value store database. A table (or a set of tables) may be used to store metadata information associated with one or more files stored within the distributed file system 112. The metadata information may include the name of a file, a size of the file, file permissions associated with the file, when the file was last modified, and file mapping information associated with an identification of the location of the file stored within a cluster of physical machines. In one embodiment, a new file corresponding with a snapshot of a virtual machine may be stored within the distributed file system 112 and metadata associated with the new file may be stored within the distributed metadata store 110. The distributed metadata store 110 may also be used to store a backup schedule for the virtual machine and a list of snapshots for the virtual machine that are stored using the storage appliance 170.

In some cases, the distributed metadata store 110 may be used to manage one or more versions of a virtual machine. Each version of the virtual machine may correspond with a full image snapshot of the virtual machine stored within the distributed file system 112 or an incremental snapshot of the virtual machine (e.g., a forward incremental or reverse incremental) stored within the distributed file system 112. In one embodiment, the one or more versions of the virtual machine may correspond with a plurality of files. The plurality of files may include a single full image snapshot of the virtual machine and one or more incrementals derived from the single full image snapshot. The single full image snapshot of the virtual machine may be stored using a first storage device of a first type (e.g., a HDD) and the one or more incrementals derived from the single full image snapshot may be stored using a second storage device of a second type (e.g., an SSD). In this case, only a single full image needs to be stored and each version of the virtual machine may be generated from the single full image or the single full image combined with a subset of the one or more incrementals. Furthermore, each version of the virtual machine may be generated by performing a sequential read from the first storage device (e.g., reading a single file from a HDD) to acquire the full image and, in parallel, performing one or more reads from the second storage device (e.g., performing fast random reads from an SSD) to acquire the one or more incrementals. In some cases, a first version of a virtual machine corresponding with a first snapshot of the virtual machine at a first point in time may be generated by concurrently reading a full image for the virtual machine corresponding with a state of the virtual machine prior to the first point in time from the first storage device while reading one or more incrementals from the second storage device different from the first storage device (e.g., reading the full image from a HDD at the same time as reading 64 incrementals from an SSD).

The distributed job scheduler 108 may comprise a distributed fault tolerant job scheduler, in which jobs affected by node failures are recovered and rescheduled to be run on available nodes. In one embodiment, the distributed job scheduler 108 may be fully decentralized and implemented without the existence of a master node. The distributed job scheduler 108 may run job scheduling processes on each node in a cluster or on a plurality of nodes in the cluster and each node may independently determine which tasks to execute. The distributed job scheduler 108 may be used for scheduling backup jobs that acquire and store virtual machine snapshots for one or more virtual machines over time. The distributed job scheduler 108 may follow a backup schedule to backup an entire image of a virtual machine at a particular point in time or one or more virtual disks associated with the virtual machine at the particular point in time.

The job scheduling processes running on at least a plurality of nodes in a cluster (e.g., on each available node in the cluster) may manage the scheduling and execution of a plurality of jobs. The job scheduling processes may include run processes for running jobs, cleanup processes for cleaning up failed tasks, and rollback processes for rolling-back or undoing any actions or tasks performed by failed jobs. In one embodiment, the job scheduling processes may detect that a particular task for a particular job has failed and in response may perform a cleanup process to clean up or remove the effects of the particular task and then perform a rollback process that processes one or more completed tasks for the particular job in reverse order to undo the effects of the one or more completed tasks. Once the particular job with the failed task has been undone, the job scheduling processes may restart the particular job on an available node in the cluster.

The virtualization interface 104 may provide an interface for communicating with a virtualized infrastructure manager managing a virtualization infrastructure, such as virtualized infrastructure manager 199 in FIG. 1B, and requesting data associated with virtual machine snapshots from the virtualization infrastructure. The virtualization interface 104 may communicate with the virtualized infrastructure manager using an API for accessing the virtualized infrastructure manager (e.g., to communicate a request for a snapshot of a virtual machine).

The virtual machine search index 106 may include a list of files that have been stored using a virtual machine and a version history for each of the files in the list. Each version of a file may be mapped to the earliest point in time snapshot of the virtual machine that includes the version of the file or to a snapshot of the virtual machine that includes the version of the file (e.g., the latest point in time snapshot of the virtual machine that includes the version of the file). In one example, the virtual machine search index 106 may be used to identify a version of the virtual machine that includes a particular version of a file (e.g., a particular version of a database, a spreadsheet, or a word processing document). In some cases, each of the virtual machines that are backed up or protected using storage appliance 170 may have a corresponding virtual machine search index.

The data management system 102 may comprise an application running on the storage appliance that manages the capturing, storing, deduplication, compression (e.g., using a lossless data compression algorithm such as LZ4 or LZ77), and encryption (e.g., using a symmetric key algorithm such as Triple DES or AES-256) of data for the storage appliance 170. In one example, the data management system 102 may comprise a highest level layer in an integrated software stack running on the storage appliance. The integrated software stack may include the data management system 102, the virtualization interface 104, the distributed job scheduler 108, the distributed metadata store 110, and the distributed file system 112. In some cases, the integrated software stack may run on other computing devices, such as a server or computing device 154 in FIG. 1A. The data management system 102 may use the virtualization interface 104, the distributed job scheduler 108, the distributed metadata store 110, and the distributed file system 112 to manage and store one or more snapshots of a virtual machine. Each snapshot of the virtual machine may correspond with a point in time version of the virtual machine. The data management system 102 may generate and manage a list of versions for the virtual machine. Each version of the virtual machine may map to or reference one or more chunks and/or one or more files stored within the distributed file system 112. Combined together, the one or more chunks and/or the one or more files stored within the distributed file system 112 may comprise a full image of the version of the virtual machine.

In some embodiments, a plurality of versions of a virtual machine may be stored as a base file associated with a complete image of the virtual machine at a particular point in time and one or more incremental files associated with forward and/or reverse incremental changes derived from the base file. The data management system 102 may patch together the base file and the one or more incremental files in order to generate a particular version of the plurality of versions by adding and/or subtracting data associated with the one or more incremental files from the base file or intermediary files derived from the base file. In some embodiments, each version of the plurality of versions of a virtual machine may correspond with a merged file. A merged file may include pointers or references to one or more files and/or one or more chunks associated with a particular version of a virtual machine. In one example, a merged file may include a first pointer or symbolic link to a base file and a second pointer or symbolic link to an incremental file associated with the particular version of the virtual machine. In some embodiments, the one or more incremental files may correspond with forward incrementals (e.g., positive deltas), reverse incrementals (e.g., negative deltas), or a combination of both forward incrementals and reverse incrementals.

Figure 1D:
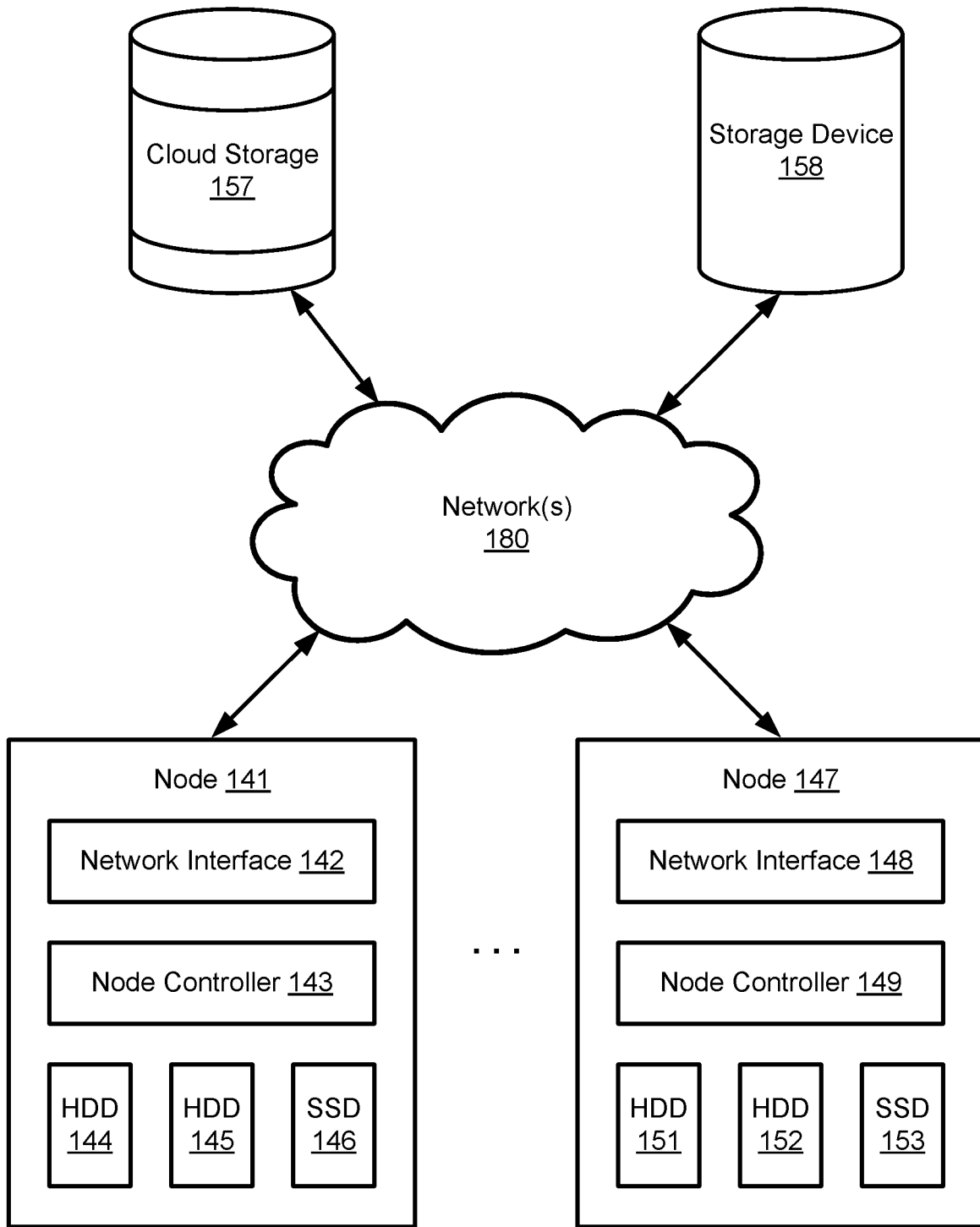
FIG. 1D depicts one embodiment of a portion of an integrated data management and storage system that includes a plurality of nodes in communication with each other and one or more storage devices.

FIG. 1D depicts one embodiment of a portion of an integrated data management and storage system that includes a plurality of nodes in communication with each other and one or more storage devices via one or more networks 180. The plurality of nodes may be networked together and present themselves as a unified storage system. The plurality of nodes includes node 141 and node 147. The one or more storage devices include storage device 157 and storage device 158. Storage device 157 may correspond with a cloud-based storage (e.g., private or public cloud storage). Storage device 158 may comprise a hard disk drive (HDD), a magnetic tape drive, a solid-state drive (SSD), a storage area network (SAN) storage device, or a networked-attached storage (NAS) device. The integrated data management and storage system may comprise a distributed cluster of storage appliances in which each of the storage appliances includes one or more nodes. In one embodiment, node 141 and node 147 may comprise two nodes housed within a first storage appliance, such as storage appliance 170 in FIG. 1C. In another embodiment, node 141 may comprise a first node housed within a first storage appliance and node 147 may comprise a second node housed within a second storage appliance different from the first storage appliance. The first storage appliance and the second storage appliance may be located within a data center, such as data center 150 in FIG. 1A, or located within different data centers.

As depicted, node 141 includes a network interface 142, a node controller 143, and a first plurality of storage devices including HDDs 144-145 and SSD 146. The first plurality of storage devices may comprise two or more different types of storage devices. The node controller 143 may comprise one or more processors configured to store, deduplicate, compress, and/or encrypt data stored within the first plurality of storage devices. Node 147 includes a network interface 148, a node controller 149, and a second plurality of storage devices including HDDs 151-152 and SSD 153. The second plurality of storage devices may comprise two or more different types of storage devices. The node controller 149 may comprise one or more processors configured to store, deduplicate, compress, and/or encrypt data stored within the second plurality of storage devices. In some cases, node 141 may correspond with physical machine 120 in FIG. 1C and node 147 may correspond with physical machine 130 in FIG. 1C.

Figures 2A, 2B, 2C:
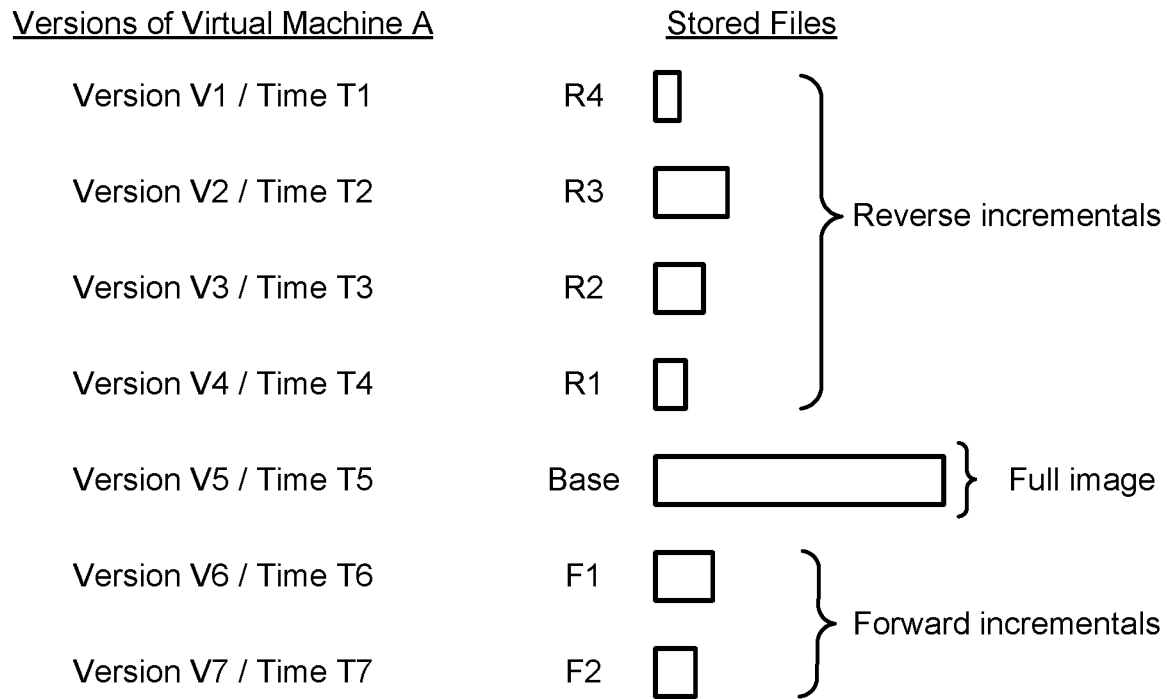
FIGS. 2A-2Q depict various embodiments of sets of files and data structures associated with managing and storing snapshots of virtual machines.
Figures 2G, 2H, 2I:
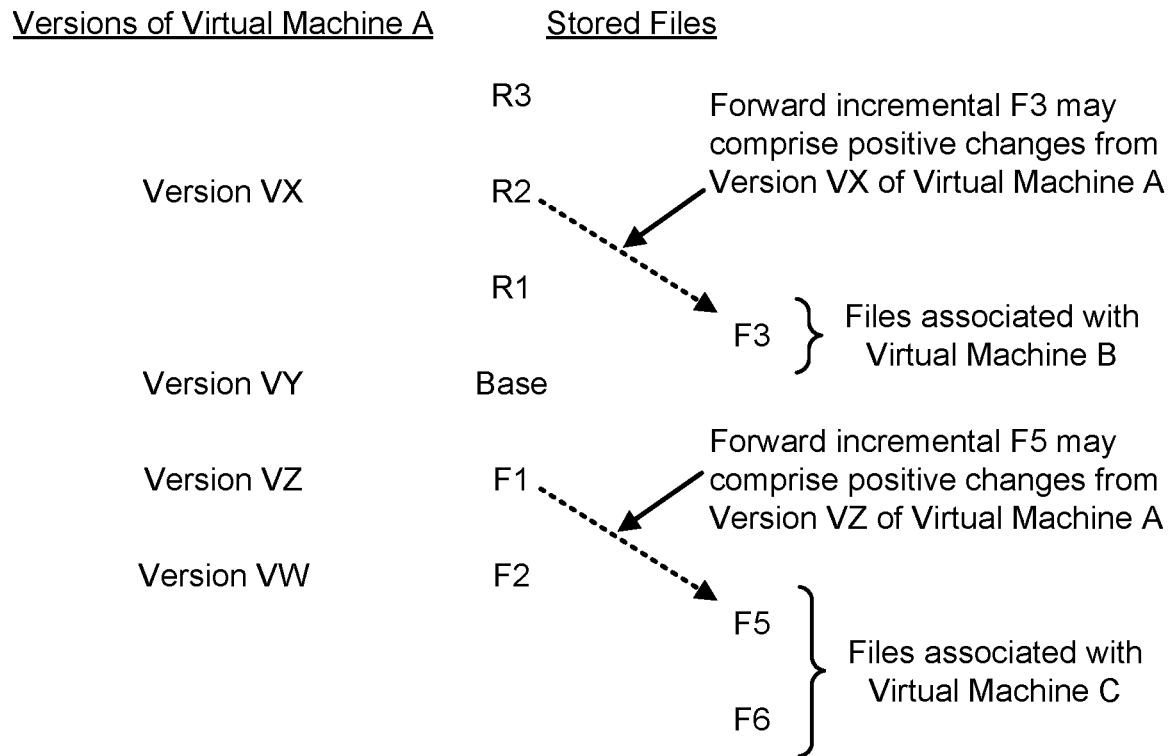
Figures 2J, 2K, 2L:
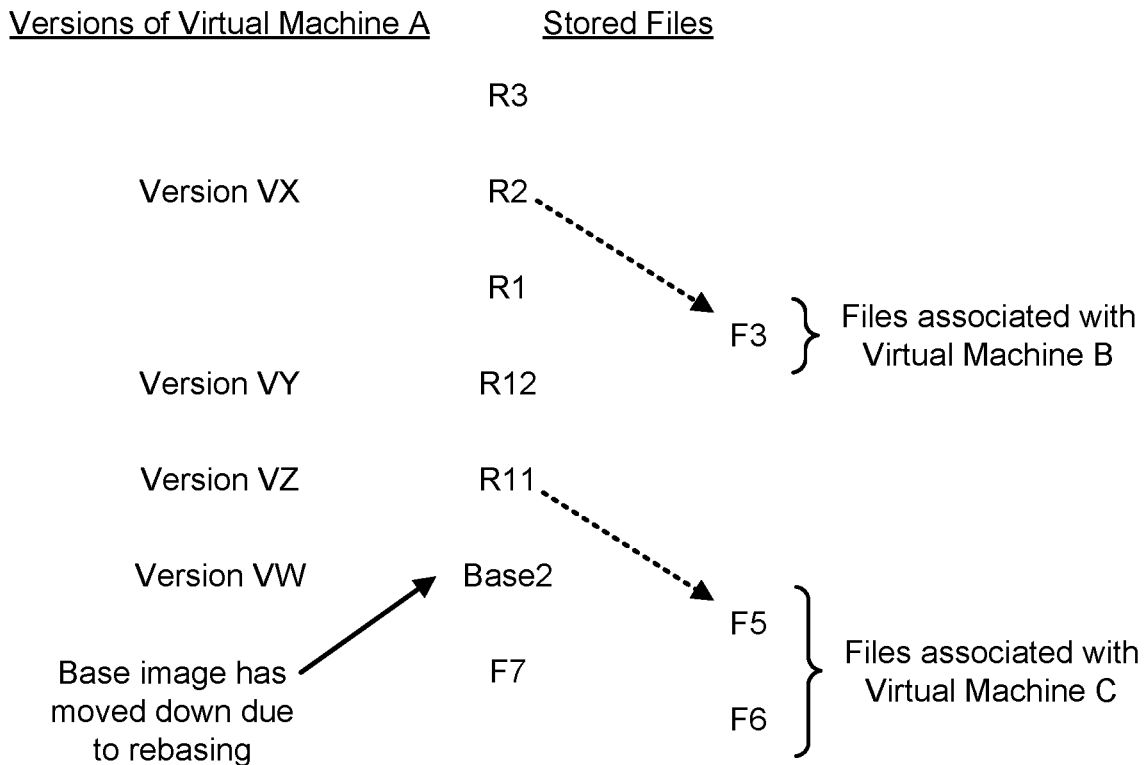
Figures 2M, 2N, 2O:
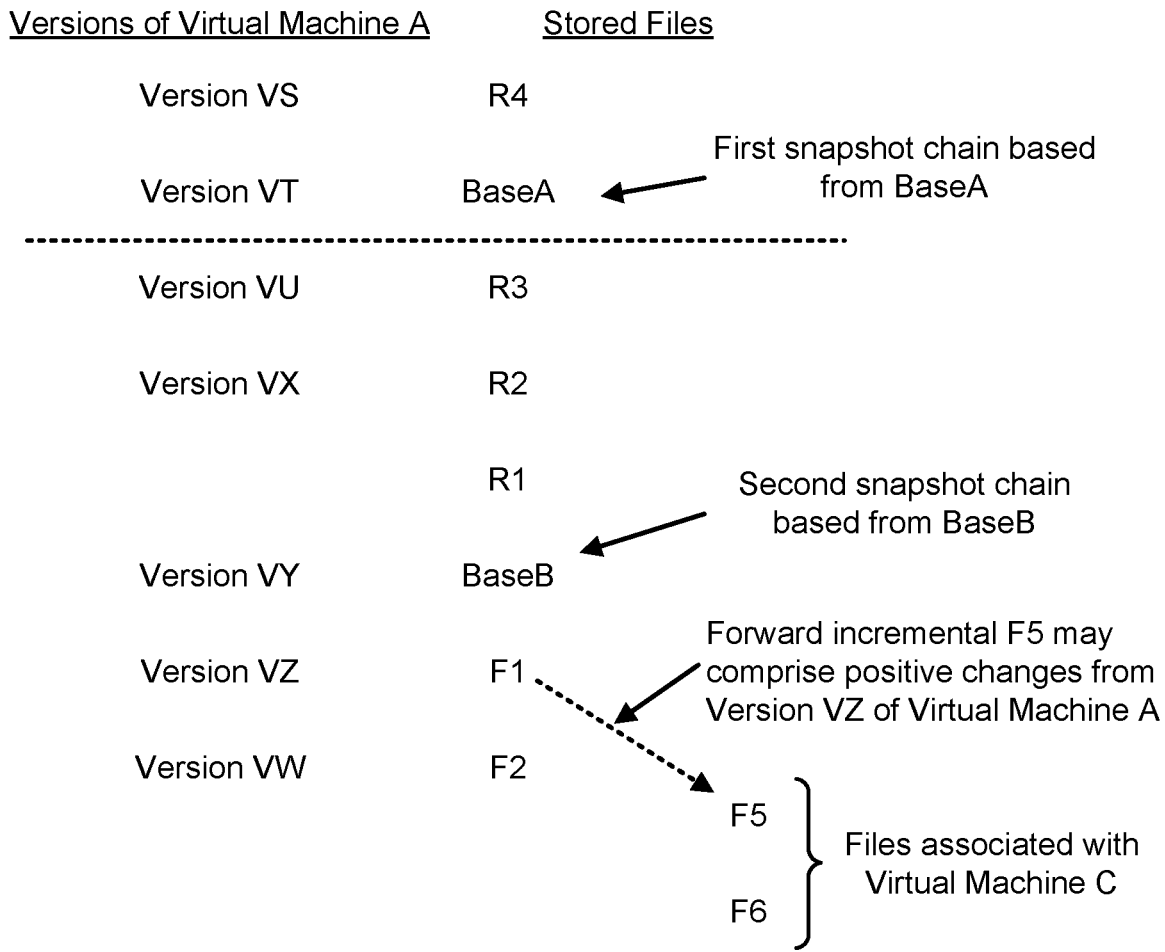
Figures 2P, 2Q:
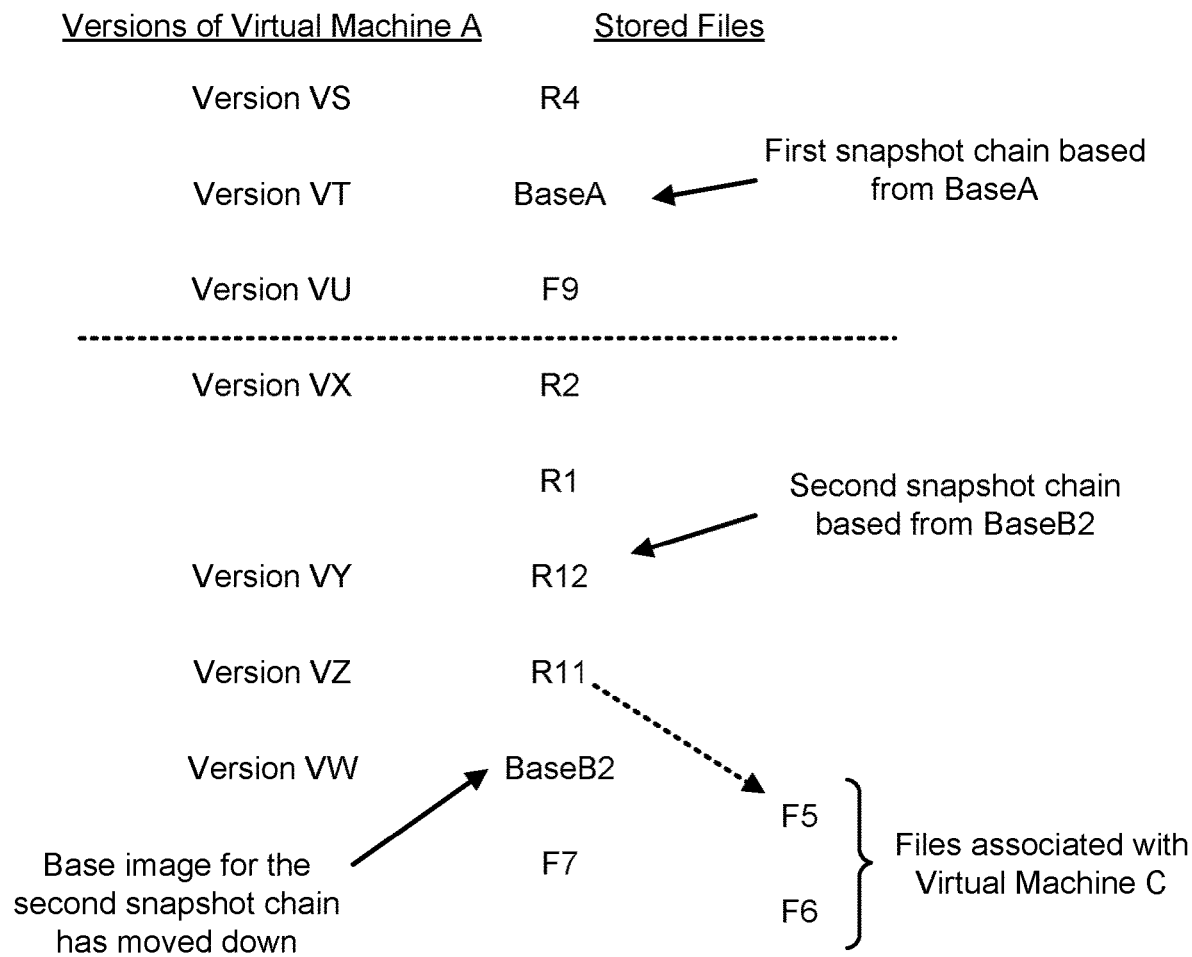

FIGS. 2A-2Q depict various embodiments of sets of files and data structures (e.g., implemented using merged files) associated with managing and storing snapshots of virtual machines.

FIG. 2A depicts one embodiment of a set of virtual machine snapshots stored as a first set of files. The first set of files may be stored using a distributed file system, such as distributed file system 112 in FIG. 1C. As depicted, the first set of files includes a set of reverse incrementals (R1-R4), a full image (Base), and a set of forward incrementals (F1-F2). The set of virtual machine snapshots includes different versions of a virtual machine (versions V1-V7 of Virtual Machine A) captured at different points in time (times T1-T7). In some cases, the file size of the reverse incremental R3 and the file size of the forward incremental F2 may both be less than the file size of the base image corresponding with version V5 of Virtual Machine A. The base image corresponding with version V5 of Virtual Machine A may comprise a full image of Virtual Machine A at point in time T5. The base image may include a virtual disk file for Virtual Machine A at point in time T5. The reverse incremental R3 corresponds with version V2 of Virtual Machine A and the forward incremental F2 corresponds with version V7 of Virtual Machine A. The forward incremental F1 may be associated with the data changes that occurred to Virtual Machine A between time T5 and time T6. The forward incremental F1 may include one or more changed data blocks.

In some embodiments, each snapshot of the set of virtual machine snapshots may be stored within a storage appliance, such as storage appliance 170 in FIG. 1A. In other embodiments, a first set of the set of virtual machine snapshots may be stored within a first storage appliance and a second set of the set of virtual machine snapshots may be stored within a second storage appliance, such as storage appliance 140 in FIG. 1A. In this case, a data management system may extend across both the first storage appliance and the second storage appliance. In one example, the first set of the set of virtual machine snapshots may be stored within a local cluster repository (e.g., recent snapshots of the file may be located within a first data center) and the second set of the set of virtual machine snapshots may be stored within a remote cluster repository (e.g., older snapshots or archived snapshots of the file may be located within a second data center) or a cloud repository.

FIG. 2B depicts one embodiment of a merged file for generating version V7 of Virtual Machine A using the first set of files depicted in FIG. 2A. The merged file includes a first pointer (pBase) that references the base image Base (e.g., via the path /snapshots/VM_A/s5/s5.full), a second pointer (pF1) that references the forward incremental F1 (e.g., via the path /snapshots/VM_A/s6/s6.delta), and a third pointer (pF2) that references the forward incremental F2 (e.g., via the path /snapshots/VM_A/s7/s7.delta). In one embodiment, to generate the full image of version V7 of Virtual Machine A, the base image may be acquired, the data changes associated with forward incremental F1 may be applied to (or patched to) the base image to generate an intermediate image, and then the data changes associated with forward incremental F2 may be applied to the intermediate image to generate the full image of version V7 of Virtual Machine A.

FIG. 2C depicts one embodiment of a merged file for generating version V2 of Virtual Machine A using the first set of files depicted in FIG. 2A. The merged file includes a first pointer (pBase) that references the base image Base (e.g., via the path /snapshots/VM_A/s5/s5.full), a second pointer (pR1) that references the reverse incremental R1 (e.g., via the path /snapshots/VM_A/s4/s4.delta), a third pointer (pR2) that references the reverse incremental R2 (e.g., via the path /snapshots/VM_A/s3/s3.delta), and a fourth pointer (pR3) that references the reverse incremental R3 (e.g., via the path /snapshots/VM_A/s2/s2.delta). In one embodiment, to generate the full image of version V2 of Virtual Machine A, the base image may be acquired, the data changes associated with reverse incremental R1 may be applied to the base image to generate a first intermediate image, the data changes associated with reverse incremental R2 may be applied to the first intermediate image to generate a second intermediate image, and then the data changes associated with reverse incremental R3 may be applied to the second intermediate image to generate the full image of version V2 of Virtual Machine A.

FIG. 2D depicts one embodiment of a set of virtual machine snapshots stored as a second set of files after a rebasing process has been performed using the first set of files in FIG. 2A. The second set of files may be stored using a distributed file system, such as distributed file system 112 in FIG. 1C. The rebasing process may generate new files R12, R11, and Base2 associated with versions V5-V7 of Virtual Machine A in order to move a full image closer to a more recent version of Virtual Machine A and to improve the reconstruction time for the more recent versions of Virtual Machine A. The data associated with the full image Base in FIG. 2A may Be equivalent to the new file R12 patched over R11 and the full image Base2. Similarly, the data associated with the full image Base2 may be equivalent to the forward incremental F2 in FIG. 2A patched over F1 and the full image Base in FIG. 2A.

The process of moving the full image snapshot for the set of virtual machine snapshots to correspond with the most recent snapshot version may be performed in order to shorten or reduce the chain lengths for the newest or most recent snapshots, which may comprise the snapshots of Virtual Machine A that are the most likely to be accessed. In some cases, a rebasing operation (e.g., that moves the full image snapshot for a set of virtual machine snapshots to correspond with the most recent snapshot version) or a reverse operation may be triggered when a number of forward incremental files is greater than a threshold number of forward incremental files for a snapshot chain (e.g., more than 200 forward incremental files). In other cases, a rebasing operation or a reverse operation may be triggered when the total disk size for the forward incremental files exceeds a threshold disk size (e.g., is greater than 200 GB) or is greater than a threshold percentage (e.g., is greater than 20%) of the base image for the snapshot chain.

In some cases, the rebasing process may be part of a periodic rebasing process that is applied at a rebasing frequency (e.g., every 24 hours) to each virtual machine of a plurality of protected virtual machines to reduce the number of forward incremental files that need to be patched to a base image in order to restore the most recent version of a virtual machine. Periodically reducing the number of forward incremental files may reduce the time to restore the most recent version of the virtual machine as the number of forward incremental files that need to be applied to a base image to generate the most recent version may be limited. In one example, if a rebasing process is applied to snapshots of a virtual machine every 24 hours and snapshots of the virtual machine are acquired every four hours, then the number of forward incremental files may be limited to at most five forward incremental files.

As depicted, the second set of files includes a set of reverse incrementals (R11-R12 and R1-R4) and a full image (Base2). The set of virtual machine snapshots includes the different versions of the virtual machine (versions V1-V7 of Virtual Machine A) captured at the different points in time (times T1-T7) depicted in FIG. 2A. In some cases, the file size of the reverse incremental R2 may be substantially less than the file size of the base image Base2. The reverse incremental R2 corresponds with version V2 of Virtual Machine A and the base image Base2 corresponds with version V7 of Virtual Machine A. In this case, the most recent version of Virtual Machine A (i.e., the most recent restore point for Virtual Machine A) comprises a full image. To generate earlier versions of Virtual Machine A, reverse incrementals may be applied to (or patched to) the full image Base2. Subsequent versions of Virtual Machine A may be stored as forward incrementals that depend from the full image Base2.

In one embodiment, a rebasing process may be applied to a first set of files associated with a virtual machine in order to generate a second set of files to replace the first set of files. The first set of files may include a first base image from which a first version of the virtual machine may be derived and a first forward incremental file from which a second version of the virtual machine may be derived. The second set of files may include a second reverse incremental file from which the first version of the virtual machine may be derived and a second base image from which the second version of the virtual machine may be derived. During the rebasing process, data integrity checking may be performed to detect and correct data errors in the files stored in a file system, such as distributed file system 112 in FIG. 1C, that are read to generate the second set of files.

FIG. 2E depicts one embodiment of a merged file for generating version V7 of Virtual Machine A using the second set of files depicted in FIG. 2D. The merged file includes a first pointer (pBase2) that references the base image Base2 (e.g., via the path /snapshots/VM_A/s7/s7.full). In this case, the full image of version V7 of Virtual Machine A may be directly acquired without patching forward incrementals or reverse incrementals to the base image Base2 corresponding with version V7 of Virtual Machine A.

FIG. 2F depicts one embodiment of a merged file for generating version V2 of Virtual Machine A using the second set of files depicted in FIG. 2D. The merged file includes a first pointer (pBase2) that references the base image Base2 (e.g., via the path /snapshots/VM_A/s7/s7.full), a second pointer (pR11) that references the reverse incremental R11 (e.g., via the path /snapshots/VM_A/s6/s6.delta), a third pointer (pR12) that references the reverse incremental R12 (e.g., via the path /snapshots/VM_A/s5/s5.delta), a fourth pointer (pR1) that references the reverse incremental R1 (e.g., via the path /snapshots/VM_A/s4/s4.delta), a fifth pointer (pR2) that references the reverse incremental R2 (e.g., via the path /snapshots/VM_A/s3/s3.delta), and a sixth pointer (pR3) that references the reverse incremental R3 (e.g., via the path /snapshots/VM_A/s2/s2.delta). In one embodiment, to generate the full image of version V2 of Virtual Machine A, the base image may be acquired, the data changes associated with reverse incremental R11 may be applied to the base image to generate a first intermediate image, the data changes associated with reverse incremental R12 may be applied to the first intermediate image to generate a second intermediate image, the data changes associated with reverse incremental R1 may be applied to the second intermediate image to generate a third intermediate image, the data changes associated with reverse incremental R2 may be applied to the third intermediate image to generate a fourth intermediate image, and then the data changes associated with reverse incremental R3 may be applied to the fourth intermediate image to generate the full image of version V2 of Virtual Machine A.

FIG. 2G depicts one embodiment of a set of files associated with multiple virtual machine snapshots. The set of files may be stored using a distributed file system, such as distributed file system 112 in FIG. 1C. As depicted, the set of files includes a set of reverse incrementals (R1-R3), a full image (Base), and a set of forward incrementals (F1-F2, F3, and F5-F6). In this case, a first version of Virtual Machine B may be generated using a forward incremental F3 that derives from Version VX of Virtual Machine A and a second version of Virtual Machine C may be generated using forward incrementals F5-F6 that are derived from Version VZ of Virtual Machine A. In one example, Virtual Machine B may have been initially cloned from Version VX of Virtual Machine A and Virtual Machine C may have been initially cloned from Version VZ of Virtual Machine A.

In one embodiment, in response to a failure of a first virtual machine in a production environment (e.g., due to a failure of a physical machine running the first virtual machine), a most recent snapshot of the first virtual machine stored within a storage appliance, such as storage appliance 170 in FIG. 1C, may be mounted and made available to the production environment. In some cases, the storage appliance may allow the most recent snapshot of the first virtual machine to be mounted by a computing device within the production environment, such as server 160 in FIG. 1A. Once the most recent snapshot of the first virtual machine has been mounted, data stored within the most recent snapshot of the first virtual machine may be read and/or modified and new data may be written without the most recent snapshot of the first virtual machine being fully restored and transferred to the production environment. In some cases, a server within the production environment may boot up a failed virtual machine directly from a storage appliance, such as storage appliance 170 in FIG. 1C, acting as an NFS datastore to minimize the recovery time to recover the failed virtual machine.

FIG. 2H depicts one embodiment of a merged file for generating version V1 of Virtual Machine B using the set of files depicted in FIG. 2G. The merged file includes a first pointer (pBase) that references the base image Base, a second pointer (pR1) that references the reverse incremental R1, a third pointer (pR2) that references the reverse incremental R2, and a fourth pointer (pF3) that references the forward incremental F3. In one embodiment, to generate the full image of version V1 of Virtual Machine B, the base image associated with Version VY of Virtual Machine A may be acquired, the data changes associated with reverse incremental R1 may be applied to the base image to generate a first intermediate image, the data changes associated with reverse incremental R2 may be applied to the first intermediate image to generate a second intermediate image, and the data changes associated with forward incremental F3 may be applied to the second intermediate image to generate the full image of version V1 of Virtual Machine B.

FIG. 2I depicts one embodiment of a merged file for generating version V2 of Virtual Machine C using the set of files depicted in FIG. 2G. The merged file includes a first pointer (pBase) that references the base image Base, a second pointer (pF1) that references the forward incremental F1, a third pointer (pF5) that references the forward incremental F5, and a fourth pointer (pF6) that references the forward incremental F6. In one embodiment, to generate the full image of version V2 of Virtual Machine C, a base image (e.g., the base image associated with Version VY of Virtual Machine A) may be acquired, the data changes associated with forward incremental F1 may be applied to the base image to generate a first intermediate image, the data changes associated with forward incremental F5 may be applied to the first intermediate image to generate a second intermediate image, and the data changes associated with forward incremental F6 may be applied to the second intermediate image to generate the full image of version V2 of Virtual Machine C.

FIG. 2J depicts one embodiment of a set of files associated with multiple virtual machine snapshots after a rebasing process has been performed using the set of files in FIG. 2G. The set of files may be stored using a distributed file system, such as distributed file system 112 in FIG. 1C. The rebasing process may generate new files R12, R11, and Base2. As depicted, the set of files includes a set of reverse incrementals (R11-R12 and R1-R3), a full image (Base2), and a set of forward incrementals (F3 and F5-F7). In this case, a first version of Virtual Machine B may be generated using a forward incremental F3 that derives from Version VX of Virtual Machine A and a second version of Virtual Machine C may be generated using forward incrementals F5-F6 that are derived from Version VZ of Virtual Machine A. In one example, Virtual Machine B may have been initially cloned from Version VX of Virtual Machine A and Virtual Machine C may have been initially cloned from version VZ of Virtual Machine A. Forward incremental file F7 may include changes to Version VW of Virtual Machine A that occurred subsequent to the generation of the full image file Base2. In some cases, the forward incremental file F7 may comprise a writeable file or have file permissions allowing modification of the file, while all other files associated with earlier versions of Virtual Machine A comprise read only files.

FIG. 2K depicts one embodiment of a merged file for generating version V1 of Virtual Machine B using the set of files depicted in FIG. 2J. The merged file includes a first pointer (pBase2) that references the base image Base2, a second pointer (pR11) that references the reverse incremental R11, a third pointer (pR12) that references the reverse incremental R12, a fourth pointer (pR1) that references the reverse incremental R1, a fifth pointer (pR2) that references the reverse incremental R2, and a sixth pointer (pF3) that references the forward incremental F3. In one embodiment, to generate the full image of version V1 of Virtual Machine B, a base image (e.g., the base image associated with Version VW of Virtual Machine A) may be acquired, the data changes associated with reverse incremental R11 may be applied to the base image to generate a first intermediate image, the data changes associated with reverse incremental R12 may be applied to the first intermediate image to generate a second intermediate image, the data changes associated with reverse incremental R1 may be applied to the second intermediate image to generate a third intermediate image, the data changes associated with reverse incremental R2 may be applied to the third intermediate image to generate a fourth intermediate image, and the data changes associated with forward incremental F3 may be applied to the fourth intermediate image to generate the full image of version V1 of Virtual Machine B.

FIG. 2L depicts one embodiment of a merged file for generating version V2 of Virtual Machine C using the set of files depicted in FIG. 2J. The merged file includes a first pointer (pBase2) that references the base image Base2, a second pointer (pR11) that references the reverse incremental R11, a third pointer (pF5) that references the forward incremental F5, and a fourth pointer (pF6) that references the forward incremental F6. In one embodiment, to generate the full image of version V2 of Virtual Machine C, a base image (e.g., the base image associated with Version VW of Virtual Machine A) may be acquired, the data changes associated with reverse incremental R11 may be applied to the base image to generate a first intermediate image, the data changes associated with forward incremental F5 may be applied to the first intermediate image to generate a second intermediate image, and the data changes associated with forward incremental F6 may be applied to the second intermediate image to generate the full image of version V2 of Virtual Machine C.

In some cases, a backed-up version of a first virtual machine may be generated by concurrently reading a full image of a second virtual machine different from the first virtual machine from a first storage device (e.g., a HDD) while reading one or more incrementals associated with the first virtual machine from a second storage device (e.g., an SSD) different from the first storage device.

FIG. 2M depicts one embodiment of a set of files associated with multiple virtual machine snapshots. The set of files may be stored using a distributed file system, such as distributed file system 112 in FIG. 1C. As depicted, the set of files includes a second full image (BaseB), a set of forward incrementals (F1-F2 and F5-F6) that derive from the second full image (BaseB), and a set of reverse incrementals (R1-R3) that derive from the second full image (BaseB). The set of files also includes a first full image (BaseA) and a reverse incremental (R4) that derives from the first full image (BaseA). In this case, the depicted snapshots for Virtual Machine A include two different full image snapshots (BaseA and BaseB). Each of the full image snapshots may comprise an anchor snapshot for a snapshot chain. The first full image (BaseA) and the reverse incremental (R4) may comprise a first snapshot chain with the first full image acting as the anchor snapshot. A second snapshot chain may comprise the second full image (BaseB), the set of forward incrementals (F1-F2), and the set of reverse incrementals (R1-R3). The first snapshot chain and the second snapshot chain may be independent of each other and independently managed. For example, the base image associated with the second snapshot chain for Virtual Machine A may be repositioned (e.g., via rebasing) without impacting the first snapshot chain for Virtual Machine A.

A third snapshot chain for Virtual Machine C may comprise the second full image (BaseB) and forward incrementals (F1 and F5-F6). The first snapshot chain for Virtual Machine A and the third snapshot chain for Virtual Machine C may be independent of each other and independently managed. However, as Virtual Machine C is a dependent virtual machine that depends from the second snapshot chain for Virtual Machine A, changes to the second snapshot chain may impact the third snapshot chain. For example, repositioning of the base image for the second snapshot chain due to rebasing may require the merged files for the third snapshot chain to be updated.

In some embodiments, each of the snapshot chains for Virtual Machine A may have a maximum incremental chain length (e.g., no more than 100 total incremental files), a maximum reverse incremental chain length (e.g., no more than 50 reverse incremental files), and a maximum forward incremental chain length (e.g., no more than 70 forward incremental files. In the event that a new snapshot will cause one of the snapshot chains to violate the maximum incremental chain length, the maximum reverse incremental chain length, or the maximum forward incremental chain length, then a new snapshot chain may be created for Virtual Machine A and a new full-image base file may be stored for the new snapshot chain.

FIG. 2N depicts one embodiment of a merged file for generating version VS of Virtual Machine A using the set of files depicted in FIG. 2M. The merged file includes a first pointer (pBaseA) that references the first base image BaseA and a second pointer (pR4) that references the reverse incremental R4. In one embodiment, to generate the full image of version VS of Virtual Machine A, the first base image associated with Version VT of Virtual Machine A may be acquired and the data changes associated with reverse incremental R4 may be applied to the first base image to generate the full image of version VS of Virtual Machine A.

FIG. 2O depicts one embodiment of a merged file for generating version VU of Virtual Machine A using the set of files depicted in FIG. 2M. The merged file includes a first pointer (pBaseB) that references the second base image BaseB, a second pointer (pR1) that references the reverse incremental R1, a third pointer (pR2) that references the reverse incremental R2, and a fourth pointer (pR3) that references the reverse incremental R3. In one embodiment, to generate the full image of version VU of Virtual Machine A, the second base image associated with Version VY of Virtual Machine A may be acquired, the data changes associated with reverse incremental R1 may be applied to the second base image to generate a first intermediate image, the data changes associated with reverse incremental R2 may be applied to the first intermediate image to generate a second intermediate image, and the data changes associated with reverse incremental R3 may be applied to the second intermediate image to generate the full image of version VU of Virtual Machine A.

FIG. 2P depicts one embodiment of a set of files associated with multiple virtual machine snapshots after a rebasing process has been performed to a snapshot chain using the set of files in FIG. 2M. The set of files may be stored using a distributed file system, such as distributed file system 112 in FIG. 1C. The rebasing process may generate new files R12, R11, and BaseB2. As depicted, the set of files includes a set of reverse incrementals (R11-R12 and R1-R2), a full image (BaseB2), and a set of forward incrementals (F5-F7). In this case, a second version of Virtual Machine C may be generated using forward incrementals F5-F6 that are derived from Version VZ of Virtual Machine A. Forward incremental file F7 may include changes to Version VW of Virtual Machine A that occurred subsequent to the generation of the full image file BaseB2. In some cases, the forward incremental file F7 may comprise a writeable file or have file permissions allowing modification of the file, while all other files associated with earlier versions of Virtual Machine A comprise read only files.

FIG. 2Q depicts one embodiment of a merged file for generating version VU of Virtual Machine A using the set of files depicted in FIG. 2P. The merged file includes a first pointer (pBaseA) that references the first base image BaseA and a second pointer (pF9) that references the forward incremental F9. In one embodiment, to generate the full image of version VU of Virtual Machine A, the first base image associated with Version VT of Virtual Machine A may be acquired and the data changes associated with forward incremental F9 may be applied to the first base image to generate the full image of version VU of Virtual Machine A.

In some embodiments, upon detection that a second snapshot chain has reached a maximum incremental chain length (e.g., no more than 500 total incremental files), a maximum reverse incremental chain length (e.g., no more than 400 reverse incremental files), or a maximum forward incremental chain length (e.g., no more than 150 forward incremental files), an existing snapshot chain (e.g., the first snapshot chain depicted in FIG. 2P) may have its chain length extended or snapshots previously assigned to the second snapshot chain may be moved to the existing snapshot chain. For example, the first snapshot chain depicted in FIG. 2M comprises two total snapshots, while the first snapshot chain depicted in FIG. 2P comprises three total snapshots as the snapshot corresponding with version VU of Virtual Machine A has moved from the second snapshot chain to the first snapshot chain.

In some embodiments, the number of snapshots in a snapshot chain may decrease over time as older versions of a virtual machine are consolidated, archived, deleted, or moved to a different storage domain (e.g., to cloud storage) depending on the data backup and archiving schedule for the virtual machine. In some cases, the maximum incremental chain length or the maximum number of snapshots for a snapshot chain may be increased over time as the versions stored by the snapshot chain age. In one example, if the versions of a virtual machine stored using a snapshot chain are all less than one month old, then the maximum incremental chain length may be set to a maximum of 200 incrementals; however, if the versions of the virtual machine stored using the snapshot chain are all greater than one month old, then the maximum incremental chain length may be set to a maximum of 1000 incrementals.

In some embodiments, the maximum incremental chain length for a snapshot chain may be increased over time as the number of allowed snapshots in a snapshot chain may be increased as the backed-up versions of a virtual machine get older. For example, the maximum incremental chain length for a snapshot chain storing versions of a virtual machine that are less than one year old may comprise a maximum incremental chain length of 200 incrementals, while the maximum incremental chain length for a snapshot chain storing versions of a virtual machine that are more than one year old may comprise a maximum incremental chain length of 500 incrementals.

In some embodiments, the maximum incremental chain length, the maximum reverse incremental chain length, or the maximum forward incremental chain length for a snapshot chain may be adjusted over time as nodes or disks are added to or removed from a cluster or upon an update to a data backup and archiving schedule for a virtual machine due to the assignment of a new backup class or a new backup, replication, and archival policy. In one example, the maximum incremental chain length may be increased from 200 incrementals to 500 incrementals if the number of nodes or disks falls below a threshold number (e.g., is less than four nodes). In another example, the maximum incremental chain length may be increased from 100 incrementals to 200 incrementals if the available disk storage falls below a threshold amount if disk space (e.g., the amount of available disk space is less than 20 TB).

Figure 3A:
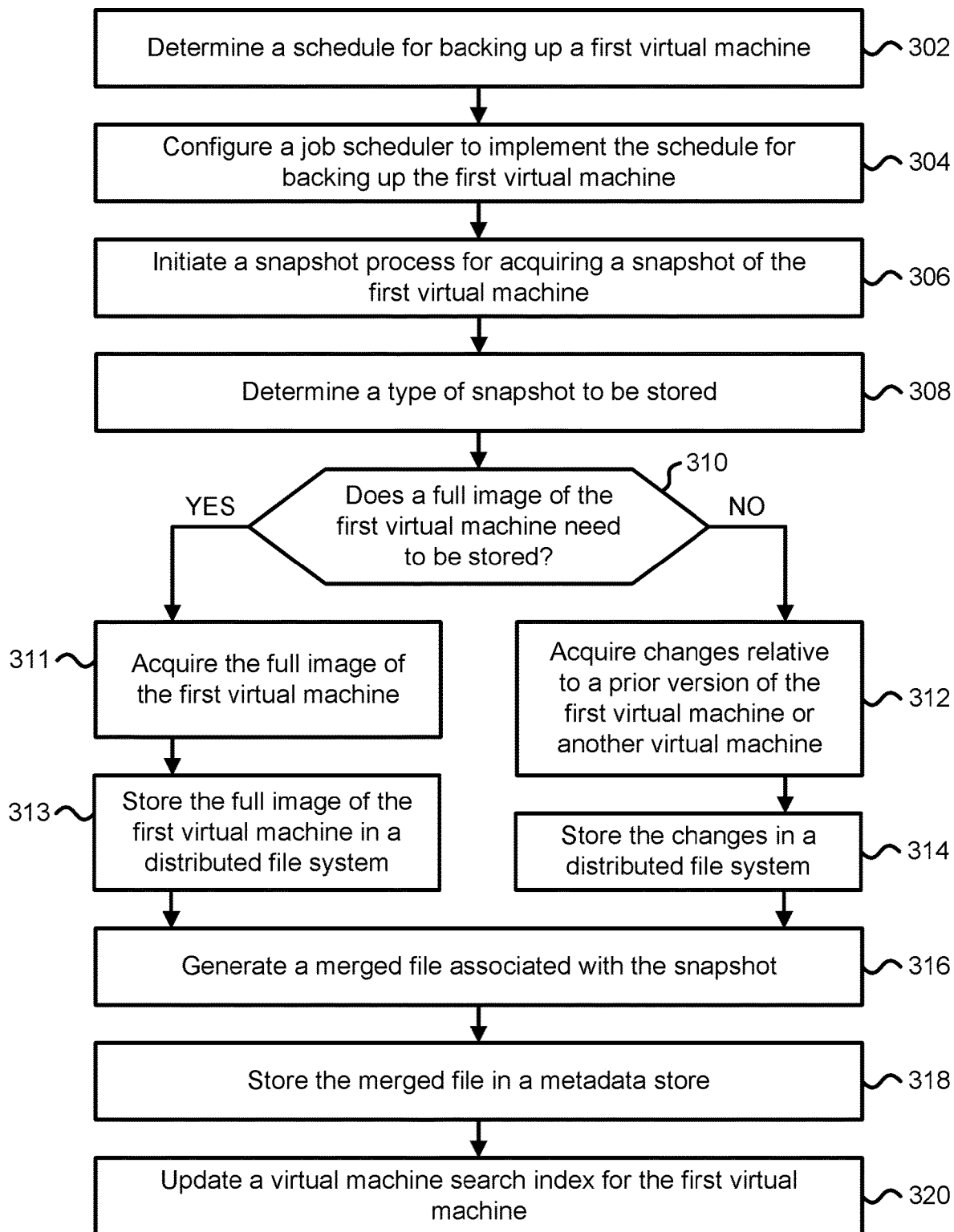
FIG. 3A is a flowchart describing one embodiment of a process for managing and storing virtual machine snapshots using a data storage system.

FIG. 3A is a flowchart describing one embodiment of a process for managing and storing virtual machine snapshots using a data storage system. In one embodiment, the process of FIG. 3A may be performed by a storage appliance, such as storage appliance 170 in FIG. 1A.

In step 302, a schedule for backing up a first virtual machine is determined. In one example, the schedule for backing up the first virtual machine may comprise periodically backing up the first virtual machine every four hours. The schedule for backing up the first virtual machine may be derived from a new backup, replication, and archival policy or backup class assigned to the first virtual machine. In step 304, a job scheduler is configured to implement the schedule for backing up the first virtual machine. In one example, a distributed job scheduler, such as distributed job scheduler 108 in FIG. 1C, may be configured to schedule and run processes for capturing and storing images of the first virtual machine over time according the schedule. In step 306, a snapshot process for acquiring a snapshot of the first virtual machine is initiated. The snapshot process may send an instruction to a virtualized infrastructure manager, such as virtualization manager 169 in FIG. 1A, that requests data associated with the snapshot of the first virtual machine. In step 308, a type of snapshot to be stored is determined. The type of snapshot may comprise a full image snapshot or an incremental snapshot. In some cases, a full image snapshot may be captured and stored in order to serve as an anchor snapshot for a new snapshot chain. Versions of the first virtual machine may be stored using one or more independent snapshot chains, wherein each snapshot chain comprises a full image snapshot and one or more incremental snapshots. One embodiment of a process for determining the type of snapshot to be stored (e.g., storing either a full image snapshot or an incremental snapshot) is described later in reference to FIG. 3B.

In step 310, it is determined whether a full image of the first virtual machine needs to be stored in order to store the snapshot of the first virtual machine. The determination of whether a full image is required may depend on whether a previous full image associated with a prior version of the first virtual machine has been acquired. The determination of whether a full image is required may depend on the determination of the type of snapshot to be stored in step 308. If a full image needs to be stored, then step 311 is performed. Otherwise, if a full image does not need to be stored, then step 312 is performed. In step 311, the full image of the first virtual machine is acquired. The full image of the first virtual machine may correspond with a file or one or more data chunks. In step 312, changes relative to a prior version of the first virtual machine or relative to another virtual machine (e.g., in the case that the first virtual machine comprises a dependent virtual machine whose snapshots derive from a full image snapshot of a second virtual machine different from the first virtual machine) are acquired. The changes relative to the prior version of the first virtual machine or relative to a version of a different virtual machine may correspond with a file or one or more data chunks. In step 313, the full image of the first virtual machine is stored using a distributed file system, such as distributed file system 112 in FIG. 1C. In step 314, the changes relative to the prior version of the first virtual machine or relative to another virtual machine are stored using a distributed file system, such as distributed file system 112 in FIG. 1C. In one embodiment, the full image of the first virtual machine may be stored using a first storage device of a first type (e.g., a HDD) and the changes relative to the prior version of the first virtual machine may be stored using a second storage device of a second type (e.g., an SSD).

In some embodiments, snapshots of the first virtual machine may be ingested at a snapshot capture frequency (e.g., every 30 minutes) by a data storage system. When a snapshot of the first virtual machine is ingested, the snapshot may be compared with other snapshots stored within the data storage system in order to identify a candidate snapshot from which the snapshot may depend. In one example, a scalable approximate matching algorithm may be used to identify the candidate snapshot whose data most closely matches the data associated with the snapshot or to identify the candidate snapshot whose data has the fewest number of data differences with the snapshot. In another example, an approximate matching algorithm may be used to identify the candidate snapshot whose data within a first portion of the candidate snapshot most closely matches data associated with a first portion of the snapshot. In some cases, a majority of the data associated with the snapshot and the candidate snapshot may be identical (e.g., both the snapshot and the candidate snapshot may be associated with virtual machines that use the same operation system and have the same applications installed). Once the candidate snapshot has been identified, then data differences (or the delta) between the snapshot and the candidate snapshot may be determined and the snapshot may be stored based on the data differences. In one example, the snapshot may be stored using a forward incremental file that includes the data differences between the snapshot and the candidate snapshot. The forward incremental file may be compressed prior to being stored within a file system, such as distributed file system 112 in FIG. 1C.

In step 316, a merged file associated with the snapshot is generated. The merged file may reference one or more files or one or more data chunks that have been acquired in either step 311 or step 312. In one example, the merged file may comprise a file or a portion of a file that includes pointers to the one or more files or the one or more data chunks. In step 318, the merged file is stored in a metadata store, such as distributed metadata store 110 in FIG. 1C. In step 320, a virtual machine search index for the first virtual machine is updated. The virtual machine search index for the first virtual machine may include a list of files that have been stored in the first virtual machine and a version history for each of the files in the list. In one example, the virtual machine search index for the first virtual machine may be updated to include new files that have been added to the first virtual machine since a prior snapshot of the first virtual machine was taken and/or to include updated versions of files that were previously stored in the first virtual machine.

Figure 3B:
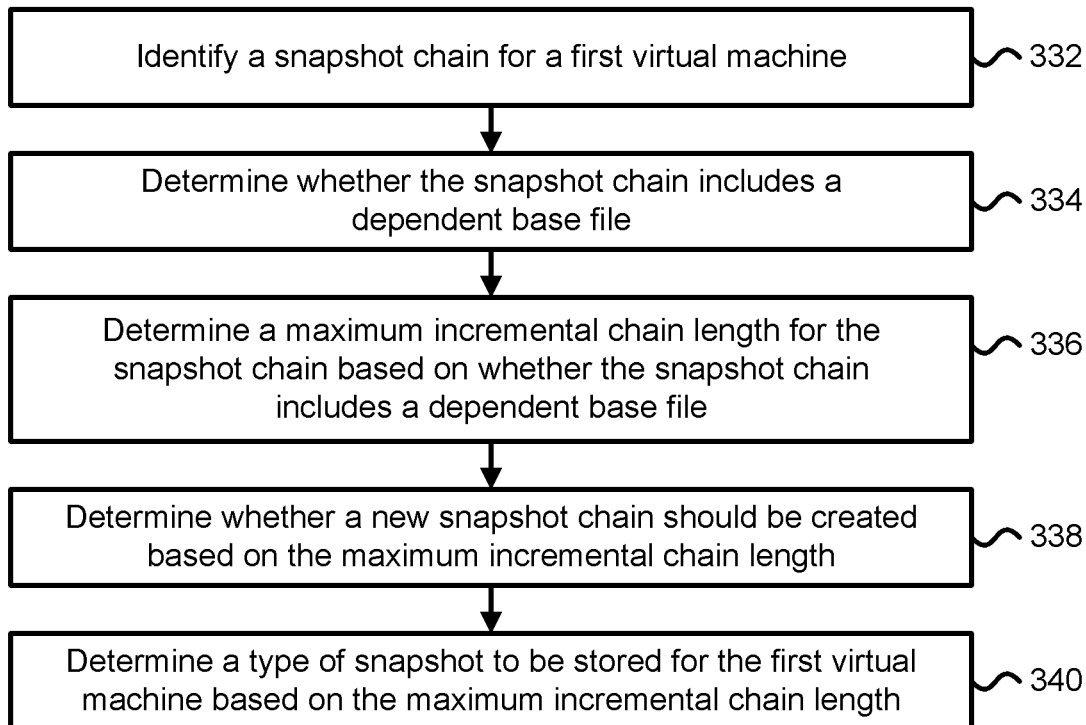
FIG. 3B is a flowchart describing one embodiment of a process for determining the type of snapshot to be stored using a data storage system.

FIG. 3B is a flowchart describing one embodiment of a process for determining the type of snapshot to be stored using a data storage system. The process described in FIG. 3B is one example of a process for implementing step 308 in FIG. 3A. In one embodiment, the process of FIG. 3B may be performed by a storage appliance, such as storage appliance 170 in FIG. 1A.

In step 332, a snapshot chain for a first virtual machine is identified. The snapshot chain may comprise a full image snapshot for the first virtual machine and one or more incremental snapshots that derive from the full image snapshot. Backed-up versions of the first virtual machine may correspond with one or more snapshot chains. Each of the one or more snapshot chains may include a full image snapshot or a base image from which incremental snapshots may derive. One example of backed-up versions of a virtual machine being stored using one or more snapshot chains is depicted in FIG. 2P in which the versions of Virtual Machine A are stored using a first snapshot chain anchored by full image BaseA and a second snapshot chain anchored by full image BaseB2.

In step 334, it is determined whether the snapshot chain includes a dependent base file. In this case, the first virtual machine may comprise a dependent virtual machine that has snapshots that derive from a full image snapshot of a different virtual machine. In one embodiment, the first virtual machine and the different virtual machine from which the first virtual machine depends may each have different virtual machine configuration files for storing configuration settings for the virtual machines. In one example, the first virtual machine may have a first number of virtual processors (e.g., two processors) and the different virtual machine may have a second number of virtual processors different from the first number of virtual processors (e.g., four processors). In another example, the first virtual machine may have a first virtual memory size (e.g., 1 GB) and the different virtual machine may have a second virtual memory size different from the first virtual memory size (e.g., 2 GB). In another example, the first virtual machine may run a first guest operating system and the different virtual machine may run a second guest operating system different from the first guest operating system.

In step 336, a maximum incremental chain length for the snapshot chain is determined based on whether the snapshot chain includes a dependent base file. In one example, if the first virtual machine comprises a dependent virtual machine, then the maximum incremental chain length may be set to a maximum length of 200 snapshots; however if the first virtual machine is independent and is not a dependent virtual machine, then the maximum incremental chain length may be set to a maximum length of 500 snapshots.

In one embodiment, the maximum incremental chain length for the snapshot chain may be determined based on an age of the backed-up versions within the snapshot chain. In one example, the maximum incremental chain length for a snapshot chain storing versions of the first virtual machine that are less than one year old may comprise a maximum incremental chain length of 100 incrementals, while the maximum incremental chain length for a snapshot chain storing versions of the first virtual machine that are more than one year old may comprise a maximum incremental chain length of 200 incrementals.

In step 338, it is determined whether a new snapshot chain should be created based on the maximum incremental chain length. In step 340, a type of snapshot to be stored for the first virtual machine is determined based on the maximum incremental chain length. The type of snapshot may comprise either a full image snapshot or an incremental snapshot. In one embodiment, if the snapshot chain for the first virtual machine exceeds the maximum incremental chain length for the snapshot chain, then the type of snapshot to be stored for the first virtual machine may comprise a full image snapshot. In this case, an additional snapshot chain may be created for the first virtual machine.

Figure 3C:
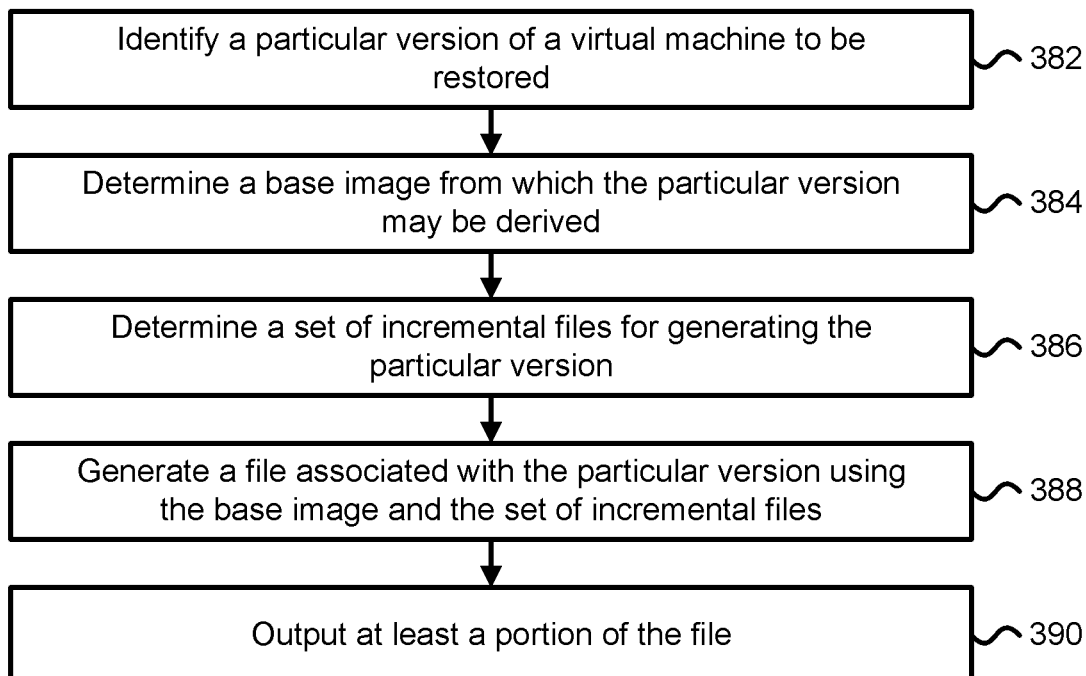
FIG. 3C is a flowchart describing one embodiment of a process for restoring a version of a virtual machine using a data storage system.

FIG. 3C is a flowchart describing one embodiment of a process for restoring a version of a virtual machine using a data storage system. In one embodiment, the process of FIG. 3C may be performed by a storage appliance, such as storage appliance 170 in FIG. 1A.

In step 382, a particular version of a virtual machine to be restored is identified. In step 384, a base image from which the particular version may be derived is determined. In step 386, a set of incremental files for generating the particular version is determined. In one embodiment, the base image and the set of incremental files may be determined from a merged file associated with the particular version of the virtual machine. In some cases, the set of incremental files may include one or more forward incremental files and one or more reverse incremental files. In step 388, a file associated with the particular version is generated using the base image and the set of incremental files. The file may be generated by patching the set of incremental files onto the base image.

In one example, referring to FIG. 2G, if the particular version corresponds with Version V2 of Virtual Machine C, then the base image may correspond with the file Base in FIG. 2G and the set of incremental files may correspond with files F1, F5, and F6 of FIG. 2G. In another example, referring to FIG. 2G, if the particular version corresponds with Version V1 of Virtual Machine B, then the base image may correspond with the file Base in FIG. 2G and the set of incremental files may correspond with files R1, R2, and F3 of FIG. 2G. In step 390, at least a portion of the file is outputted. The at least a portion of the file may be electronically transferred to a computing device, such as computing device 154 in FIG. 1A, or to a virtualization manager, such as virtualization manager 169 in FIG. 1A.

In some embodiments, the base image and a subset of the set of incremental files may correspond with a second virtual machine different from the virtual machine. In this case, the base image may comprise the base image for the second virtual machine and the set of incremental files may include a dependent base file that comprises data differences between the base image for the second virtual machine and a previously acquired base image for the virtual machine. Data deduplication techniques may be applied to identify a candidate base image from which a dependent base file may depend and to generate the dependent base file.

Figure 4A:
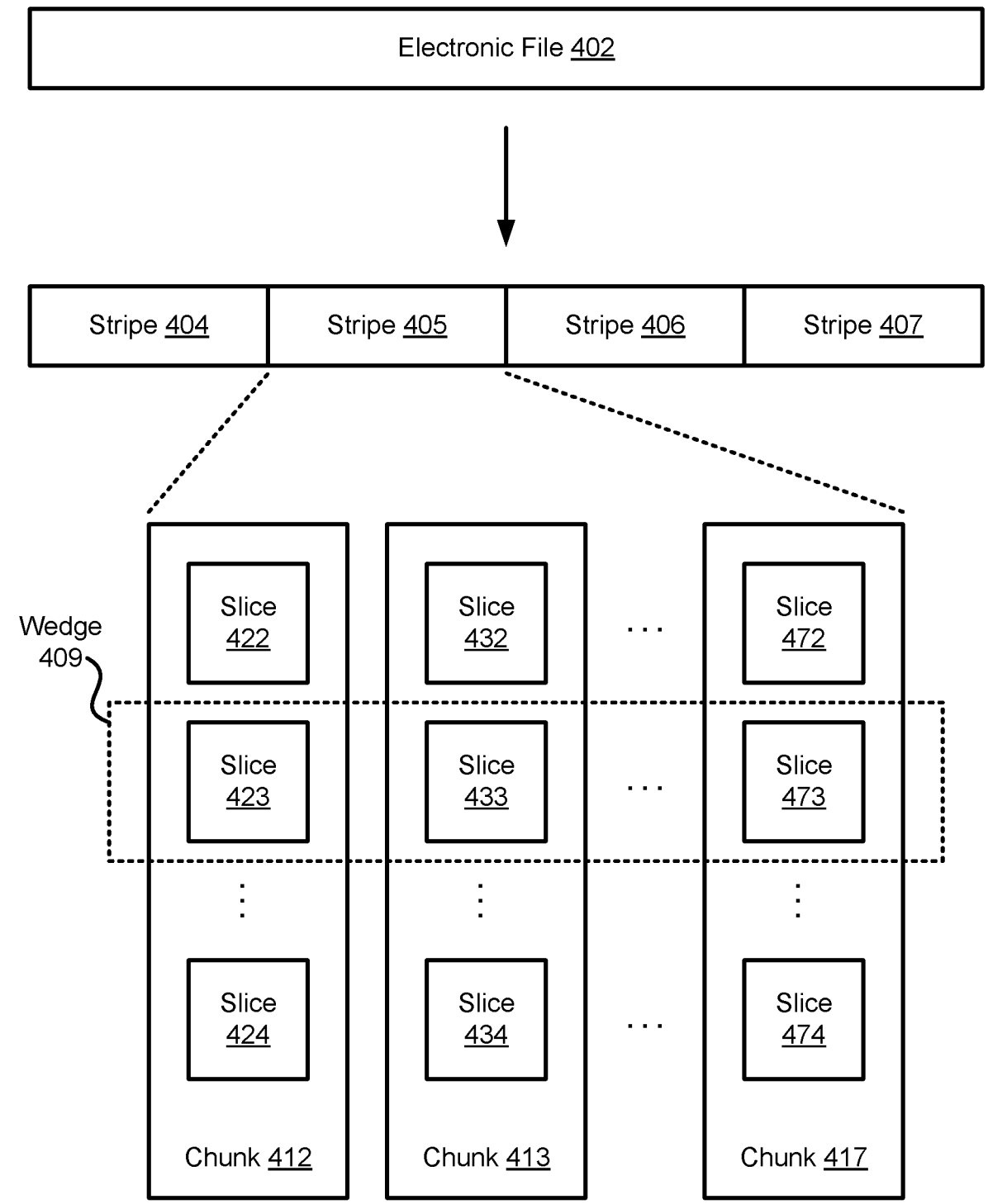
FIG. 4A depicts one embodiment of a data arrangement for storing an electronic file using a plurality of disks.

FIG. 4A depicts one embodiment of a data arrangement for storing an electronic file using a plurality of disks. As depicted, an electronic file 402 (e.g., a spreadsheet, a database file, or a virtual disk file) has been partitioned into four stripes 404-407. The electronic file 402 may be partitioned into four equal-sized data stripes. In one example, a first stripe 405 of the four stripes 404-407 may comprise a 256 MB portion of the electronic file 402. The first stripe 405 may be stored using a plurality of data chunks 412-417. Each data chunk of the plurality of data chunks 412-417 may be stored using a particular disk out of a plurality of disks. The plurality of data chunks 412-417 may be stored using a plurality of disks (e.g., a plurality of HDDs) with a one-to-one correspondence between the plurality of data chunks and the plurality of disks. Each data chunk of the plurality of data chunks 412-417 may include one or more data slices. Data chunk 412 includes data slices 422-424. Data chunk 413 includes data slices 432-434. Data chunk 417 includes data slices 472-474. A wedge 409 of data slices may comprise a horizontal grouping of data slices across the plurality of chunks. The wedge 409 includes data slice 423 from data chunk 412, data slice 433 from data chunk 413, and data slice 473 from data chunk 417. The data slice 423 and the data slice 433 may correspond with data blocks and the data slice 473 may correspond with a code block generated using an error correcting scheme applied to data blocks of the wedge 409. The data slices of the wedge 409 may be written to the plurality of disks in parallel. The data slices of the wedge 409 may be read in parallel from the plurality of disks after they have been written to the plurality of disks.

In one embodiment, the wedge 409 may comprise a first wedge (or first horizontal data slice grouping) of the first stripe 405. A second wedge of the first stripe 405 may include data slice 422 from data chunk 412, data slice 432 from data chunk 413, and data slice 472 from data chunk 417. A third wedge of the first stripe 405 may include data slice 424 from data chunk 412, data slice 434 from data chunk 413, and data slice 474 from data chunk 417. The lengths or data sizes of the data slices within the first wedge, the second wedge, and the third wedge may be the same data size (e.g., all comprising 64 KB of data). In some cases, the data slice lengths or the data sizes of the data slices within the first wedge, the second wedge, and the third wedge may be of different sizes; for example, the data sizes of the data slices within the first wedge may comprise 128 KB data blocks while the data sizes of the data slices within the second wedge may comprise 64 KB data blocks.

Figure 4B:
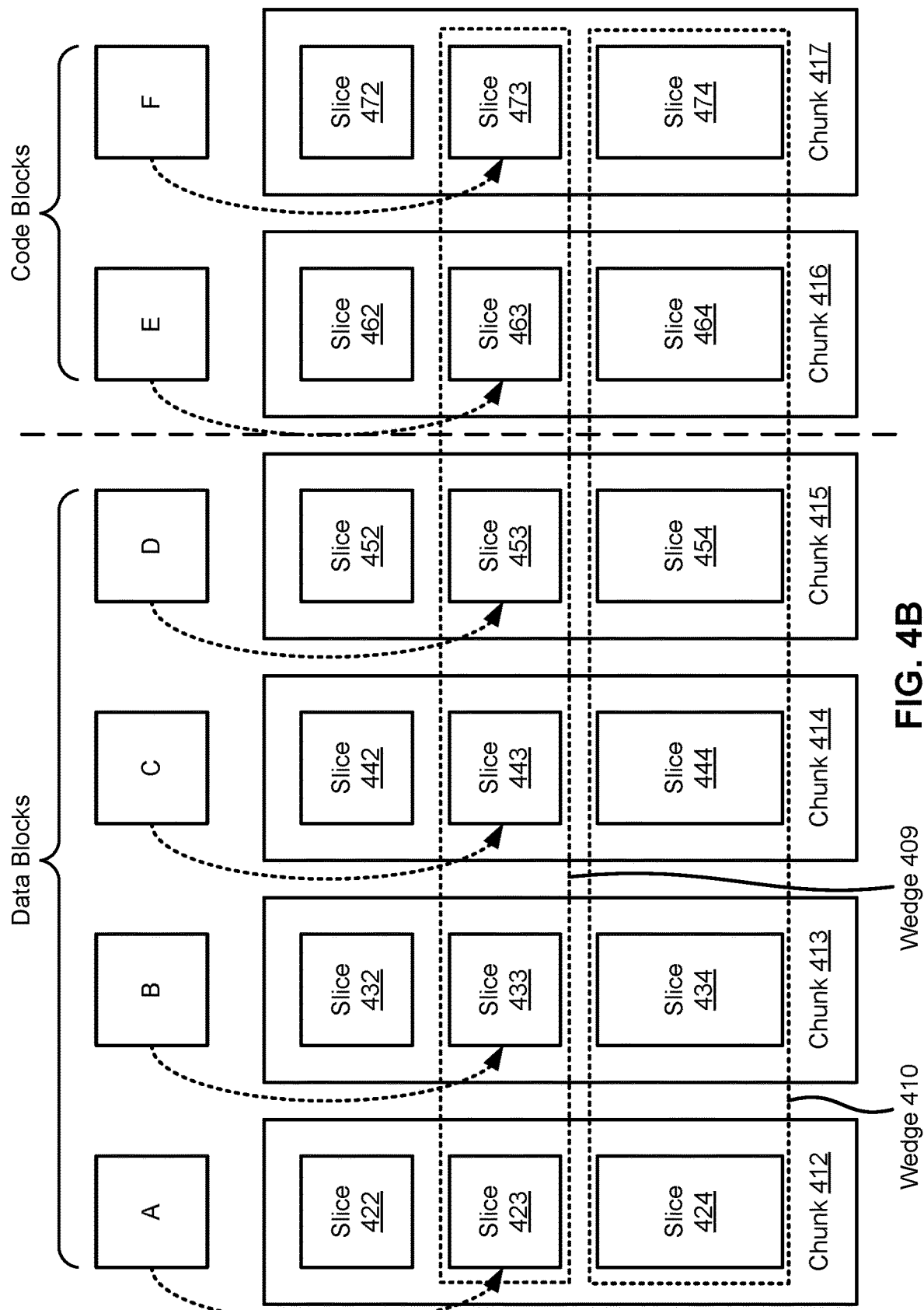
FIG. 4B depicts one embodiment of mapping data blocks and code blocks associated with portions of an electronic file to a plurality of disks for storing the data blocks and the code blocks.

FIG. 4B depicts one embodiment of mapping data blocks and code blocks associated with portions of an electronic file to a plurality of disks for storing the data blocks and the code blocks. As depicted, a portion of an electronic file (e.g., a data stripe for the electronic file) has been mapped to data slices within a plurality of data chunks 412-417. The first wedge 409 comprises data slice 423 from data chunk 412, data slice 433 from data chunk 413, data slice 443 from data chunk 414, data slice 453 from data chunk 415, data slice 463 from data chunk 416, and data slice 473 from data chunk 417. The data slices 423, 433, 443, and 453 may correspond with data blocks A-D and data slices 463 and 473 may correspond with code blocks E-F that are generated via application of an error correcting scheme (e.g., Reed Solomon encoding) to the data blocks A-D within the first wedge 409. The data slices within the first wedge 409 may be used to implement a four data block/two code block (4+2) Reed Solomon encoding.

The second wedge 410 comprises data slice 424 from data chunk 412, data slice 434 from data chunk 413, data slice 444 from data chunk 414, data slice 454 from data chunk 415, data slice 464 from data chunk 416, and data slice 474 from data chunk 417. The data slices 424, 434, 444, and 454 may correspond with data blocks derived from the electronic file and data slices 464 and 474 may correspond with code blocks that are generated via application of an error correcting scheme (e.g., Reed Solomon encoding) to the data blocks within the second wedge. The data slices within the second wedge 410 may be used to implement a four data block/two code block (4+2) Reed Solomon encoding. In one embodiment, the length of the data slices within the first wedge 409 may correspond with 64 KB data sizes while the length of the data slices within the second wedge 410 may correspond with 256 KB data sizes.

Figure 5A:
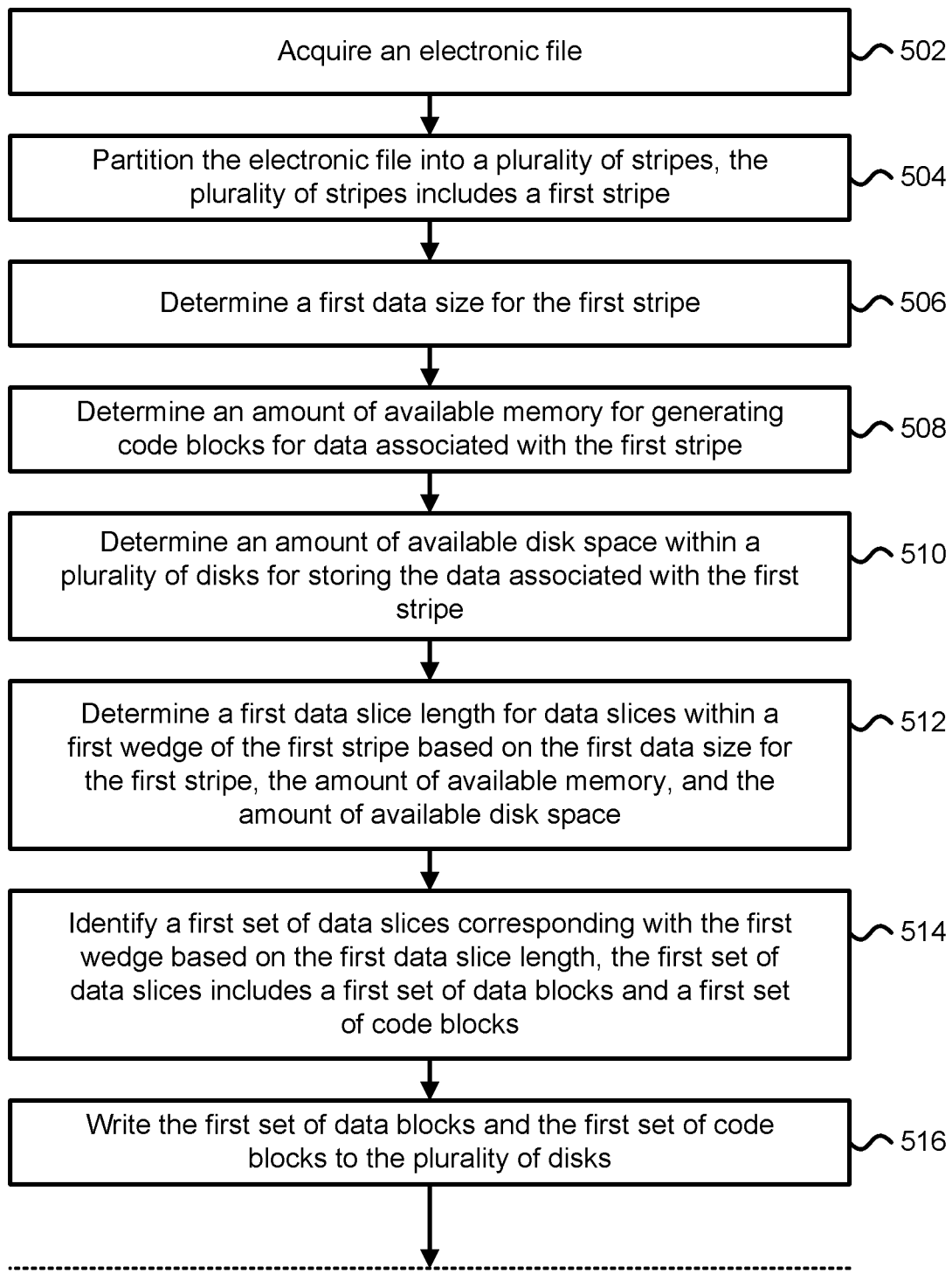
FIGS. 5A-5B depict a flowchart describing one embodiment of a process for identifying data slices associated with a horizontal grouping of data slices across a plurality of data chunks and writing the data slices to a plurality of disks.
Figure 5B:
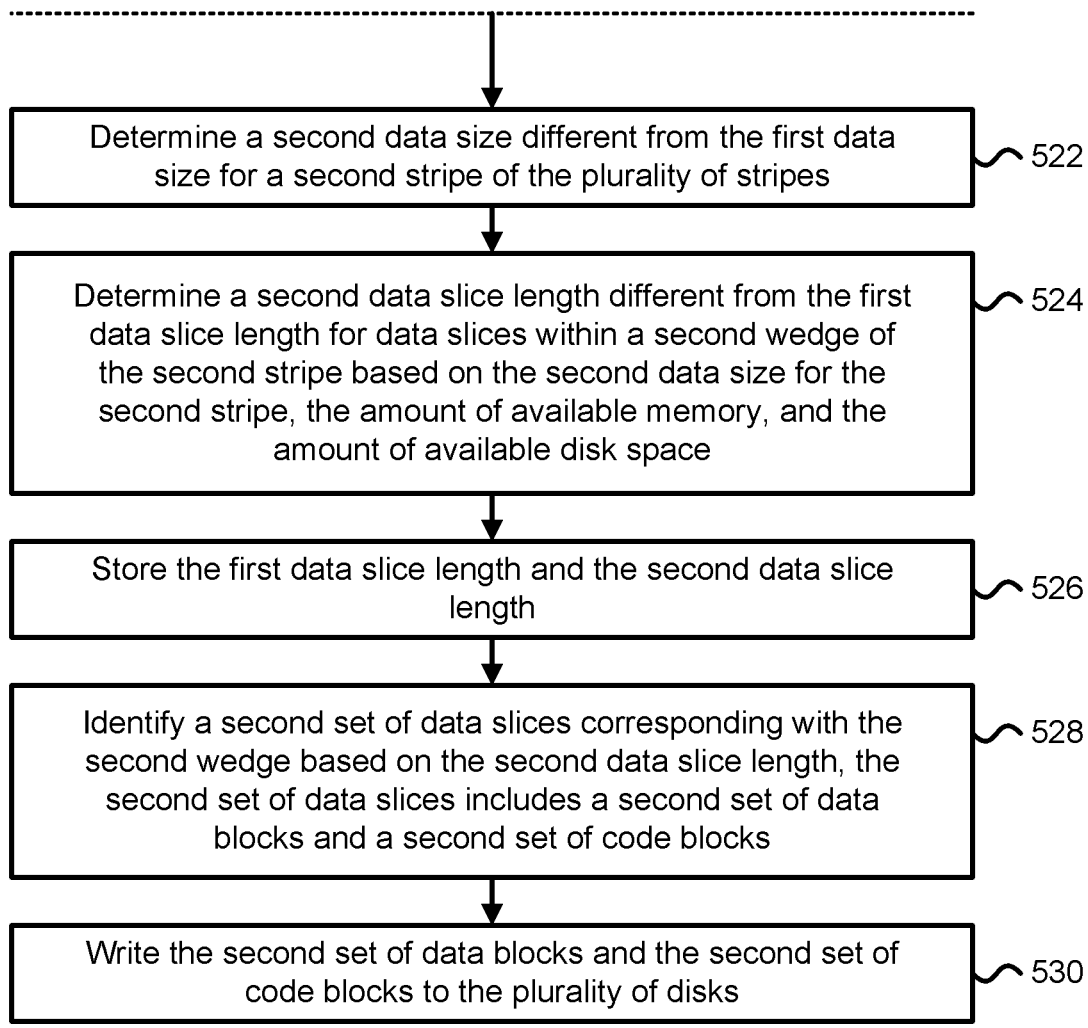

FIGS. 5A-5B depict a flowchart describing one embodiment of a process for identifying data slices associated with a wedge (or horizontal grouping of data slices across a plurality of data chunks) and writing the data slices to a plurality of disks. In one embodiment, the process of FIGS. 5A-5B may be performed by a storage appliance, such as storage appliance 170 in FIG. 1A.

In step 502, an electronic file is acquired. The electronic file may be acquired from a server, such as server 160 in FIG. 1A. In step 504, the electronic file is partitioned into a plurality of stripes. The plurality of stripes may include a first stripe and a second stripe. In one example, the first stripe may correspond with stripe 405 in FIG. 4A and the second stripe may correspond with stripe 406 in FIG. 4A. In step 506, a first data size for the first stripe is determined. In one example, the first stripe may comprise 128 MB of data from the electronic file and the first data size may comprise 128 MB. In step 508, an amount of available memory for generating code blocks for data associated with the first stripe is determined. The amount of available memory may comprise the amount of RAM available to store data blocks and generate code blocks for the data blocks. The memory may comprise a volatile memory or a non-volatile memory. The memory may comprise a DRAM, an SRAM, or a Flash-based memory.

In step 510, an amount of available disk space within a plurality of disks for storing the data associated with the first stripe is determined. The amount of available disk space within the plurality of disks may correspond with the amount of disk space available to store additional information using the plurality of disks. In step 512, a first data slice length for data slices within a first wedge of the first stripe is determined based on the first data size for the first stripe, the amount of available memory, and/or the amount of available disk space. In one embodiment, the first data slice length for the data slices within the first wedge may be determined based on a file size of the electronic file or the first data size for the first stripe. In another embodiment, the first data slice length for the data slices within the first wedge may be determined based on the amount of available memory to generate code blocks for the first wedge. In another embodiment, the first data slice length for the data slices within the first wedge may be determined based on the amount of available (or un-used) disk space within the plurality of disks.

In step 514, a first set of data slices corresponding with the first wedge is identified based on the first data slice length. The first set of data slices may comprise a first set of data blocks and a first set of code blocks. In one example, the first set of data blocks may correspond with data blocks A-D in FIG. 4B and the first set of code blocks may correspond with code blocks E-F in FIG. 4B. In step 516, the first set of data blocks and the first set of code blocks are written to the plurality of disks. The first set of data blocks and the first set of code blocks may be concurrently written to the plurality of disks.

In step 522, a second data size different from the first data size for a second stripe of the plurality of stripes is determined. The first stripe may correspond with a 128 MB portion of the electronic file and the second stripe may correspond with a 256 MB portion of the electronic file. In step 524, a second data slice length different from the first data slice length for data slices within a second wedge of the second stripe is determined based on the second data size for the second stripe, the amount of available memory, and the amount of available disk space. As the amount of available memory and the amount of available disk space may change over time as data storage nodes are added to or removed from a cluster of data storage nodes and/or as files are stored or deleted from disks within the data storage nodes, the amount of available memory and the amount of available disk space may be periodically updated with updated values.

In step 526, the first data slice length and the second data slice length are stored. In step 528, a second set of data slices corresponding with the second wedge is identified based on the second data slice length. The second set of data slices comprises a second set of data blocks and a second set of code blocks. In step 530, the second set of data blocks and the second set of code blocks are written to the plurality of disks. The second set of data blocks and the second set of code blocks may be written in parallel to the plurality of disks. In one example, the first set of data blocks may correspond with data slices 423, 433, 443, and 453 in FIG. 4B, the first set of code blocks may correspond with data slices 463 and 473 in FIG. 4B, the second set of data blocks may correspond with data slices 424, 434, 444, 454 in FIG. 4B, and the second set of code blocks may correspond with data slices 464 and 474 in FIG. 4B.

Figure 5C:
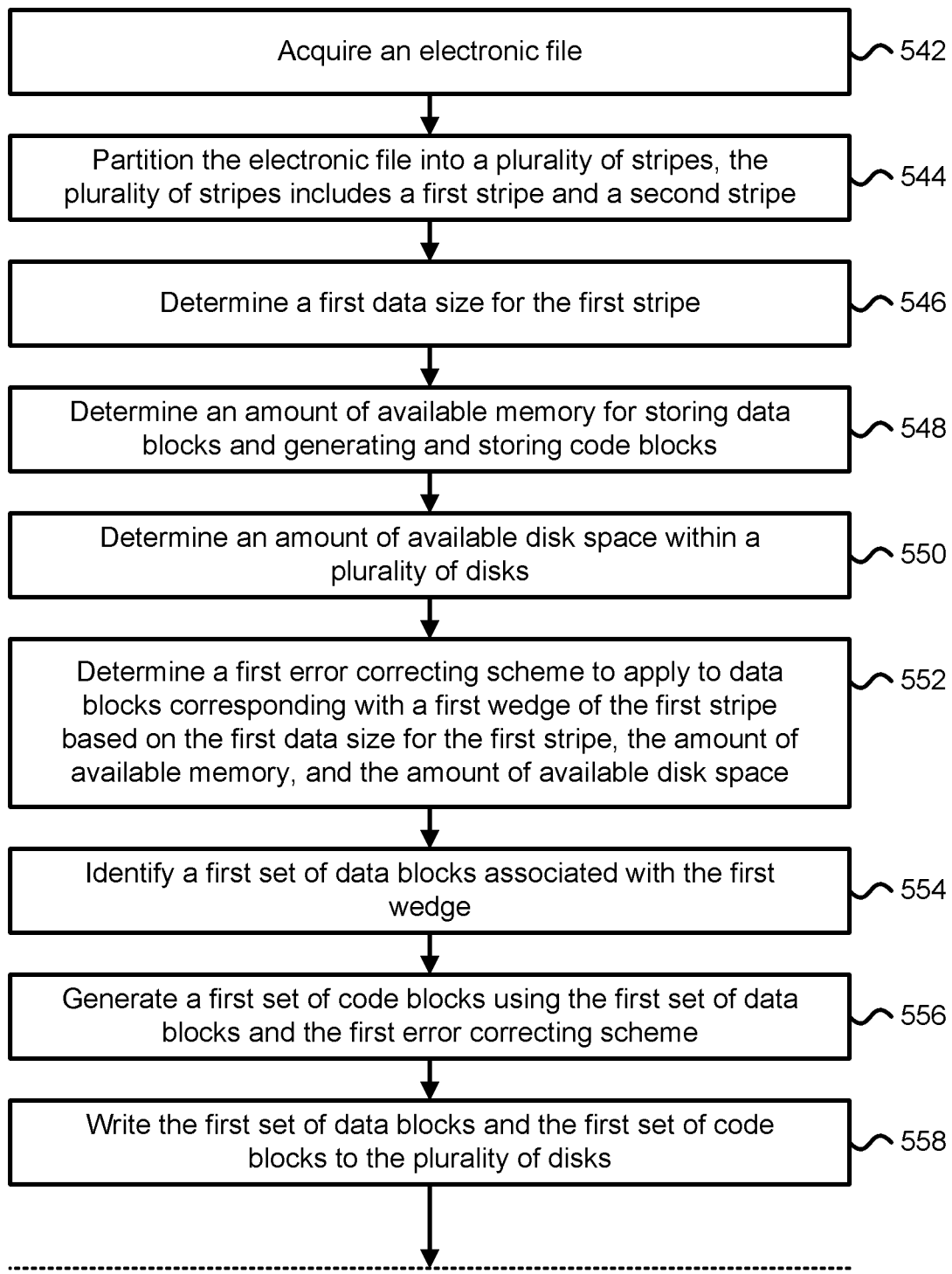
FIGS. 5C-5D depict a flowchart describing another embodiment of a process for identifying data slices associated with a horizontal grouping of data slices across a plurality of data chunks and writing the data slices to a plurality of disks.
Figure 5D:
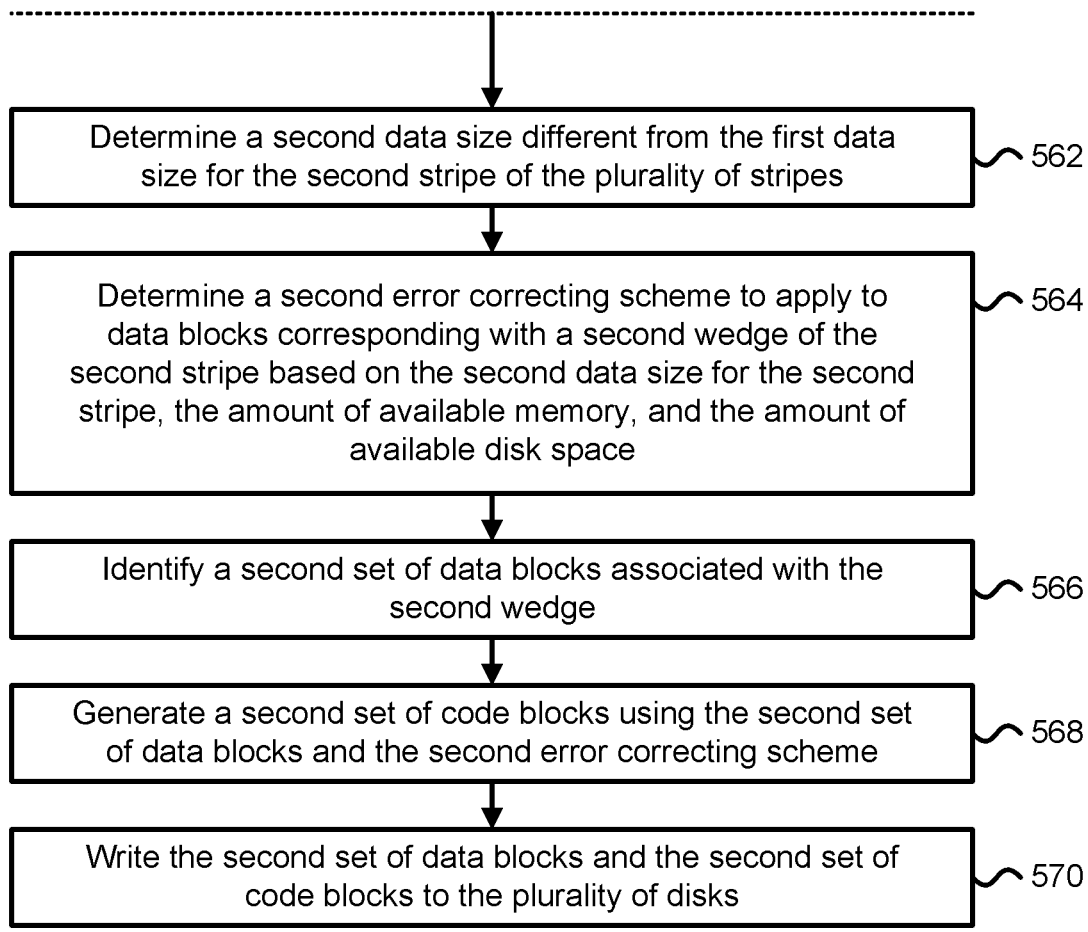

FIGS. 5C-5D depict a flowchart describing another embodiment of a process for identifying data slices associated with a wedge (or horizontal grouping of data slices across a plurality of data chunks) and writing the data slices to a plurality of disks. In one embodiment, the process of FIGS. 5C-5D may be performed by a storage appliance, such as storage appliance 170 in FIG. 1A.

In step 542, an electronic file is acquired. In step 544, the electronic file is partitioned into a plurality of stripes. The plurality of stripes may include a first stripe and a second stripe. In step 546, a first data size for the first stripe is determined. In step 548, the amount of available memory for storing data blocks and generating and storing code blocks is determined. The amount of available memory may correspond with the amount of available RAM within a storage appliance, such as storage appliance 170 in FIG. 1A. In step 550, an amount of available disk space within a plurality of disks is determined. The amount of available disk space within the plurality of disks may correspond with the amount of available disk space within a storage appliance, such as storage appliance 170 in FIG. 1A. In step 552, a first error correcting scheme to apply to data blocks corresponding with a first wedge of the first stripe is determined based on the first data size for the first stripe, the amount of available memory, and/or the amount of available disk space. In one embodiment, the first error correcting scheme may be determined based on the amount of available memory and the amount of available disk space within the plurality of disks. The first error correcting scheme may be used to generate a four data block/two code block (4+2) Reed Solomon encoding. In step 554, a first set of data blocks associated with the first wedge is identified. In step 556, a first set of code blocks is generated by applying the first error correcting scheme to the first set of data blocks. The first set of code blocks may be generated by applying an erasure code to the first set of data blocks or by applying a Reed-Solomon encoding to the first set of data blocks. In step 558, the first set of data blocks and the first set of code blocks are written to the plurality of disks. The first set of data blocks and the first set of code blocks may be written in parallel to the plurality of disks.

In step 562, a second data size different from the first data size is determined for the second stripe of the plurality of stripes. In step 564, a second error correcting scheme to apply to data blocks corresponding with a second wedge of the second stripe is determined based on the second data size for the second stripe, the amount of available memory, and/or the amount of available disk space. In one embodiment, the second error correcting scheme may be determined based on the amount of available memory and the amount of available disk space within the plurality of disks, which may both vary over time as additional data storage nodes are added to or removed from a cluster of data storage nodes. The second error correcting scheme may be used to generate a six data block/three code block (6+3) Reed Solomon encoding. The second error correcting scheme may utilize a Hamming code or a BCH code for protecting data from bit errors. In step 566, a second set of data blocks associated with the second wedge is identified. In step 568, a second set of code blocks is generated by applying the second error correcting scheme to the second set of data blocks. In some cases, the first set of code blocks may correspond with a four data block/two code block (4+2) Reed Solomon encoding while the second set of code blocks may correspond with a six data block/three code block (6+3) Reed Solomon encoding. In step 570, the second set of data blocks and the second set of code blocks are written to the plurality of disks. The second set of data blocks and the second set of code blocks may be written concurrently to the plurality of disks.

One embodiment of the disclosed technology includes partitioning an electronic file into a plurality of stripes. The plurality of stripes includes a first stripe. The method further comprises determining a first data size for the first stripe, determining an amount of available memory for storing data blocks and code blocks associated with a first wedge of the first stripe, determining a first data slice length for data slices within the first wedge of the first stripe based on the first data size for the first stripe and the amount of available memory, and identifying a first set of data slices corresponding with the first wedge based on the first data slice length. The first set of data slices includes a first set of data blocks and a first set of code blocks. The method further comprises writing the first set of data blocks and the first set of code blocks to a plurality of disks such that each disk of the plurality of disks stores one of the first set of data blocks or one of the first set of code blocks.

One embodiment of the disclosed technology includes partitioning an electronic file into a plurality of stripes. The plurality of stripes includes a first stripe. The method further comprises determining a first data size for the first stripe, determining an amount of available memory for storing data blocks and code blocks associated with a first wedge of the first stripe, determining a first error correcting scheme to apply to data blocks of the first wedge of the first stripe based on the first data size for the first stripe and the amount of available memory, identifying a first set of data blocks associated with the first wedge of the first stripe, generating a first set of code blocks using the first of data blocks and the first error correcting scheme, and writing the first set of data blocks and the first of code blocks to a plurality of disks such that each disk of the plurality of disks stores one of the first set of data blocks or one of the first set of code blocks.

One embodiment of the disclosed technology includes a plurality of disks in communication with one or more processors. The one or more processors configured to partition an electronic file into a plurality of stripes. The plurality of stripes includes a first stripe. The one or more processors configured to determine a first data size for the first stripe and determine an amount of available memory for storing data blocks and code blocks associated with a first wedge of the first stripe. The one or more processors configured to determine a first data slice length for data slices within the first wedge of the first stripe based on the first data size for the first stripe and the amount of available memory. The one or more processors configured to identify a first set of data slices corresponding with the first wedge based on the first data slice length. The first set of data slices includes a first set of data blocks and a first set of code blocks. The one or more processors configured to write the first set of data blocks and the first set of code blocks to a plurality of disks such that each disk of the plurality of disks stores one of the first set of data blocks or one of the first set of code blocks.

The disclosed technology may be described in the context of computer-executable instructions, such as software or program modules, being executed by a computer or processor. The computer-executable instructions may comprise portions of computer program code, routines, programs, objects, software components, data structures, or other types of computer-related structures that may be used to perform processes using a computer. In some cases, hardware or combinations of hardware and software may be substituted for software or used in place of software.

Computer program code used for implementing various operations or aspects of the disclosed technology may be developed using one or more programming languages, including an object oriented programming language such as Java or C++, a procedural programming language such as the "C" programming language or Visual Basic, or a dynamic programming language such as Python or JavaScript. In some cases, computer program code or machine-level instructions derived from the computer program code may execute entirely on an end user's computer, partly on an end user's computer, partly on an end user's computer and partly on a remote computer, or entirely on a remote computer or server.

For purposes of this document, it should be noted that the dimensions of the various features depicted in the Figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for operating a data management system, comprising:
    partitioning an electronic file into a plurality of stripes, the plurality of stripes includes a first stripe;
    determining a first data size for the first stripe;
    determining an amount of available memory for storing data blocks and code blocks associated with a first wedge of the first stripe;
    determining a first data slice length for data slices within the first wedge of the first stripe based on the first data size for the first stripe and the amount of available memory, wherein a different size of the first data slice length is determined based on a location of the electronic file, wherein the electronic file comprises a database file and a virtual disk file;
    identifying a first set of data slices corresponding with the first wedge based on the first data slice length, the first set of data slices includes a first set of data blocks and a first set of code blocks;
    writing the first set of data blocks and the first set of code blocks to a plurality of disks such that each disk of the plurality of disks stores one of the first set of data blocks or one of the first set of code blocks; and
    determining an amount of available disk space for the plurality of disks, wherein the determining a first error correcting scheme to apply to the first set of data blocks includes determining the first error correcting scheme based on the amount of available disk space for the plurality of disks.

2. The method of claim 1, wherein:
    the determining the first data slice length for the data slices within the first wedge includes detecting that the amount of available memory is less than a threshold memory size and decreasing the first data slice length in response to detecting that the amount of available memory is less than the threshold memory size.

3. The method of claim 1, further comprising:
    determining an amount of available disk space within the plurality of disks; and
    the determining the first data slice length for the data slices within the first wedge includes determining the first data slice length for the data slices within the first wedge based on the amount of available disk space within the plurality of disks.

4. The method of claim 3, wherein:
    the determining the first data slice length for the data slices within the first wedge includes detecting that the amount of available disk space is less than a threshold disk space size and decreasing the first data slice length in response to detecting that the amount of available disk space is less than the threshold disk space size.

5. The method of claim 1, further comprising:
    determining a second data size different from the first data size for a second stripe of the plurality of stripes;
    determining a second data slice length different from the first data slice length for data slices within a second wedge of the second stripe based on the second data size for the second stripe;
    identifying a second set of data slices corresponding with the second wedge based on the second data slice length, the second set of data slices includes a second set of data blocks and a second set of code blocks; and
    writing the second set of data blocks and the second set of code blocks to the plurality of disks.

6. The method of claim 5, wherein:
    the first data slice length corresponds with 64 KB of data; and
    the second data slice length corresponds with 128 KB of data.

7. The method of claim 1, wherein:
    the plurality of disks includes two or more hard disk drives.

8. The method of claim 1, further comprising:
    determining the first error correcting scheme to apply to the first set of data blocks based on the first data size for the first stripe and the amount of available memory; and
    generating the first set of code blocks using the first of data blocks and the first error correcting scheme.

9. The method of claim 8, wherein:
    the first error correcting scheme comprises a Reed-Solomon encoding.

10. A data management system, comprising:
    a plurality of disks; and
    one or more processors configured to partition an electronic file into a plurality of stripes, the plurality of stripes includes a first stripe, the one or more processors configured to determine a first data size for the first stripe and determine an amount of available memory for storing data blocks and code blocks associated with a first wedge of the first stripe, the one or more processors configured to determine a first data slice length for data slices within the first wedge of the first stripe based on the first data size for the first stripe and the amount of available memory. wherein a different size of the first data slice length is determined based on a location of the electronic file, wherein the electronic file comprises a database file and a virtual disk file, the one or more processors configured to identify a first set of data slices corresponding with the first wedge based on the first data slice length, the first set of data slices includes a first set of data blocks and a first set of code blocks, the one or more processors configured to write the first set of data blocks and the first set of code blocks to a plurality of disks such that each disk of the plurality of disks stores one of the first set of data blocks or one of the first set of code blocks, the one or more processors configured to determine an amount of available disk space for the plurality of disks, wherein the determining a first error correcting scheme to apply to the first set of data blocks includes determining the first error correcting scheme based on the amount of available disk space for the plurality of disks.

11. The data management system of claim 10, wherein:
    the one or more processors configured to detect that the amount of available memory is less than a threshold memory size and decrease the first data slice length in response to detection that the amount of available memory is less than the threshold memory size.

12. The data management system of claim 10, wherein:
    the one or more processors configured to determine an amount of available disk space within the plurality of disks and determine the first data slice length for the data slices within the first wedge based on the amount of available disk space within the plurality of disks.

13. The data management system of claim 12, wherein:
    the one or more processors configured to detect that the amount of available disk space is less than a threshold disk space size and decrease the first data slice length in response to detection that the amount of available disk space is less than the threshold disk space size.

14. The data management system of claim 10, wherein:
the one or more processors configured to determine a second data size different from the first data size for a second stripe of the plurality of stripes and determine a second data slice length different from the first data slice length for data slices within a second wedge of the second stripe based on the second data size for the second stripe, the one or more processors identify a second set of data slices corresponding with the second wedge based on the second data slice length, the second set of data slices includes a second set of data blocks and a second set of code blocks, the one or more processors configured to write the second set of data blocks and the second set of code blocks to the plurality of disks.

15. The data management system of claim 10, wherein:
the first data slice length corresponds with 64 KB of data; and
the second data slice length corresponds with 128 KB of data.

16. The data management system of claim 10, wherein:
the plurality of disks includes two or more hard disk drives.

17. A method for operating a data management system, comprising:
partitioning an electronic file into a plurality of stripes, the plurality of stripes includes a first stripe;
determining a first data size for the first stripe;
determining an amount of available memory for storing data blocks and code blocks associated with a first wedge of the first stripe;
determining a first error correcting scheme to apply to data blocks of the first wedge of the first stripe based on the first data size for the first stripe and the amount of available memory, wherein the electronic file comprises a database file;
identifying a first set of data blocks associated with the first wedge of the first stripe;
generating a first set of code blocks using the first of data blocks and the first error correcting scheme; and
writing the first set of data blocks and the first of code blocks to a plurality of disks such that each disk of the plurality of disks stores one of the first set of data blocks or one of the first set of code blocks.

18. The method of claim 17, further comprising:
determining a second data size different from the first data size for a second stripe of the plurality of stripes;
determining a second error correcting scheme to apply to data blocks corresponding with a second wedge of the second stripe based on the second data size for the second stripe and the amount of available memory, wherein the electronic file comprises a virtual disk file;
identifying a second set of data blocks associated with the second wedge of the second stripe;
generating a second set of code blocks using the second set of data blocks and the second error correcting scheme; and
concurrently writing the second set of data blocks and the second set of code blocks to the plurality of disks.

19. The method of claim 18, wherein:
the first error correcting scheme comprises a first Reed Solomon encoding with four data blocks and two code blocks; and
the second error correcting scheme comprises a second Reed Solomon encoding with six data blocks and three code blocks.

* * * * *

UNITED STATES PATENT AND TRADEMARK OFFICE
CERTIFICATE OF CORRECTION

PATENT NO. : 10,715,184 B2
APPLICATION NO. : 15/838078
DATED : July 14, 2020
INVENTOR(S) : Banerjee et al.

Page 1 of 1

It is certified that error appears in the above-identified patent and that said Letters Patent is hereby corrected as shown below:

In the Specification

In Column 1, Line 13, delete "Windows®" and insert --Windows®-- therefor

In Column 1, Line 15, delete "X°)." and insert --X®).-- therefor

In Column 17, Line 59, delete "Be" and insert --be-- therefor

In the Claims

In Column 34, Line 33, in Claim 10, delete "memory." and insert --memory,-- therefor Signed and Sealed this
Twenty-sixth Day of January, 2021

Drew Hirshfeld
*Performing the Functions and Duties of the
Under Secretary of Commerce for Intellectual Property and
Director of the United States Patent and Trademark Office*